United States Patent
Iyengar et al.

(10) Patent No.: US 7,461,295 B1
(45) Date of Patent: Dec. 2, 2008

(54) TIMING FAILURE ANALYSIS IN A SEMICONDUCTOR DEVICE HAVING A PIPELINED ARCHITECTURE

(75) Inventors: Vinay Iyengar, Santa Clara, CA (US); Bindiganavale S. Nataraj, Cupertino, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 559 days.

(21) Appl. No.: 11/194,067

(22) Filed: Jul. 29, 2005

(51) Int. Cl.
*G06F 11/00* (2006.01)

(52) U.S. Cl. .............................. 714/25; 714/37; 714/42; 712/227

(58) Field of Classification Search .................... 714/25, 714/37, 724, 40, 42; 712/227
See application file for complete search history.

(56) References Cited

U.S. PATENT DOCUMENTS

| | | | | |
|---|---|---|---|---|
| 4,755,951 A * | 7/1988 | Hollister | ...................... | 341/122 |
| 5,226,048 A * | 7/1993 | Bandali et al. | ............... | 714/724 |
| 5,394,403 A * | 2/1995 | Klein | ........................ | 714/718 |
| 5,870,411 A * | 2/1999 | Durham et al. | .............. | 714/724 |
| 5,912,900 A * | 6/1999 | Durham et al. | .............. | 714/724 |
| 5,936,977 A * | 8/1999 | Churchill et al. | .............. | 714/26 |
| 6,006,347 A * | 12/1999 | Churchill et al. | .............. | 714/724 |
| 6,038,658 A * | 3/2000 | Chow | ......................... | 712/219 |
| 6,286,118 B1 * | 9/2001 | Churchill et al. | ............. | 714/726 |
| 6,690,595 B1 * | 2/2004 | Srinivasan et al. | ........ | 365/49.17 |
| 6,775,637 B2 * | 8/2004 | Garcia | ........................ | 702/117 |
| 6,996,032 B2 * | 2/2006 | Ganry | ........................ | 368/118 |
| 7,200,793 B1 * | 4/2007 | Kengeri et al. | .............. | 714/768 |
| 7,353,330 B2 * | 4/2008 | Waterhouse et al. | ........ | 711/108 |
| 7,355,872 B2 * | 4/2008 | Hsu et al. | ................ | 365/49.17 |
| 2003/0226000 A1 * | 12/2003 | Rhoades | ...................... | 712/218 |
| 2006/0155964 A1 * | 7/2006 | Totsuka | ...................... | 712/214 |

OTHER PUBLICATIONS

Xiaogang Du; Reddy, S.M.; Rayhawk, J.; Wu-Tung Cheng, "Testing delay faults in embedded CAMs," Test Symposium, 2003. ATS 2003. 12th Asian , vol., No., pp. 378-383, Nov. 16-19, 2003.*

* cited by examiner

*Primary Examiner*—Marc Duncan
*Assistant Examiner*—Joshua P Lottich
(74) *Attorney, Agent, or Firm*—Shemwell Mahamedi LLP; William L. Paradice, III

(57) ABSTRACT

A method of testing a semiconductor device having a pipelined architecture. Operation of a first pipeline stage of the semiconductor is disabled during a first pipelined operation to establish test data at an input of a second pipeline stage of the semiconductor device. A second pipelined operation is executed to enable the second pipeline stage to generate an intermediate result using the test data. A final result of the second pipelined operation is evaluated to determine whether the second pipeline stage produced a correct intermediate result.

18 Claims, 13 Drawing Sheets

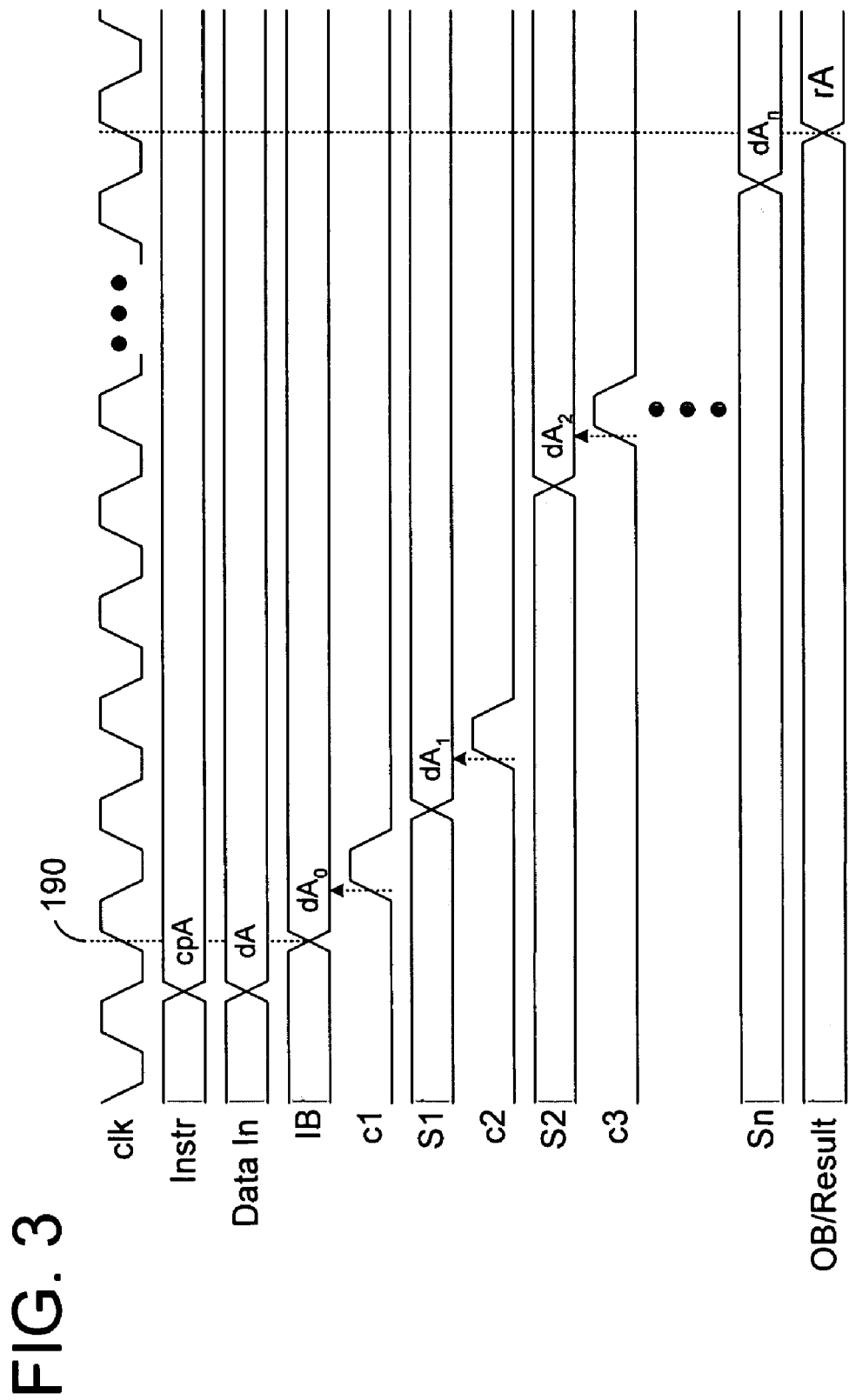

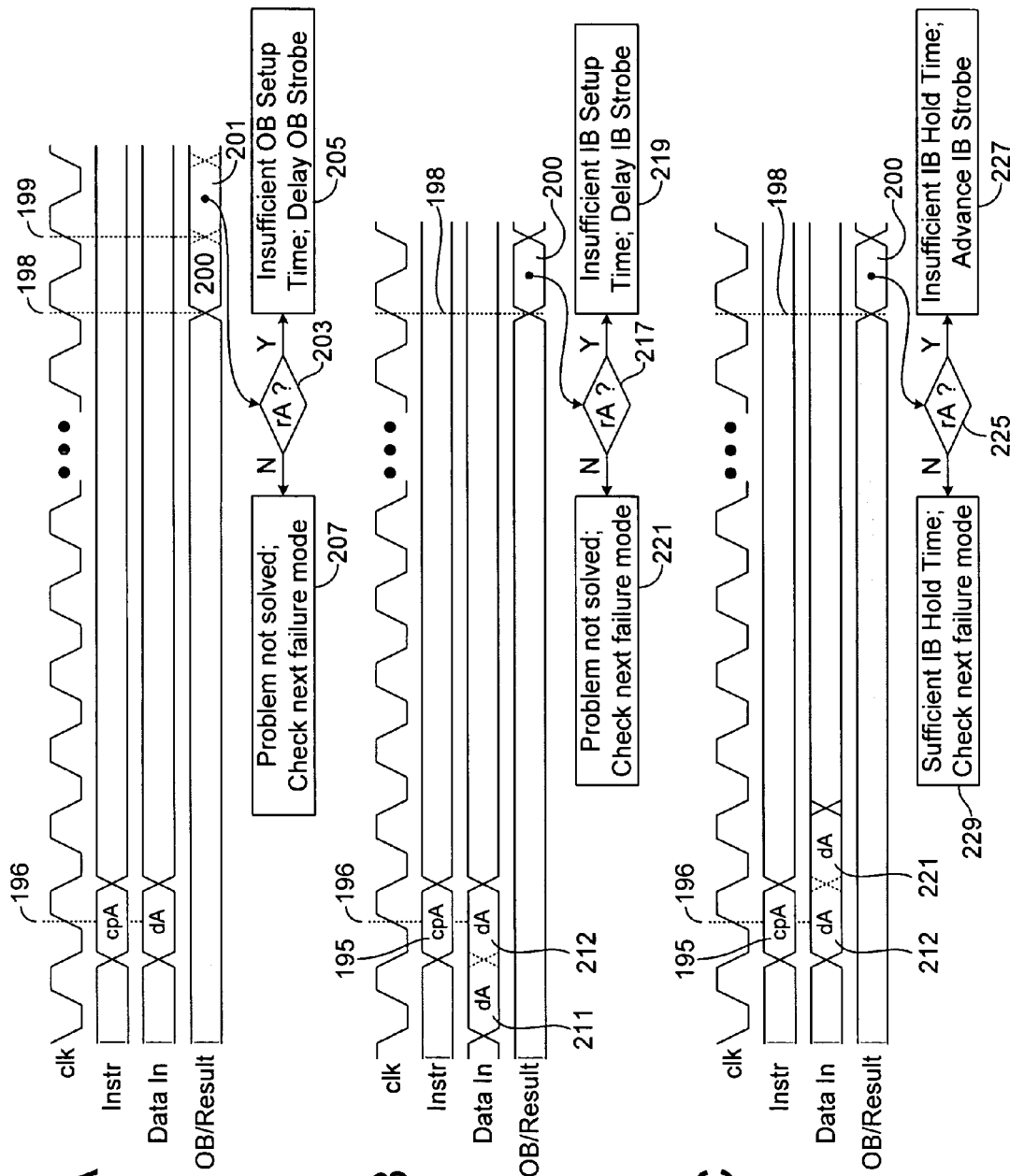

FIG. 7

|  | IB | S1 | S2 | S3 | ... | Sn-2 | Sn-1 | Sn | OB |
|---|---|---|---|---|---|---|---|---|---|
| Cycle 1: CmpA | $dA_0$ | $dA_1$ | $dA_2$ | $dA_3$ | ... | $dA_{n-2}$ | $dA_{n-1}$ | $dX_n$ | rX |
| Cycle 2: CmpA | $dA_0$ | $dA_1$ | $dA_2$ | $dA_3$ | ... | $dA_{n-2}$ | $dA_{n-1}$ | $dX_n$ | rX |
| Cycle 3: CmpA | $dA_0$ | $dA_1$ | $dA_2$ | $dA_3$ | ... | $dA_{n-2}$ | $dA_{n-1}$ | $dX_n$ | rX |
| ... | ... | ... | ... | ... | | ... | ... | ... | ... |
| Cycle n-1: CmpA | $dA_0$ | $dA_1$ | $dA_2$ | $dA_3$ | ... | $dA_{n-2}$ | $dA_{n-1}$ | $dX_n$ | rX |
| Cycle n: CmpA | $dA_0$ | $dA_1$ | $dA_2$ | $dA_3$ | ... | $dA_{n-2}$ | $dA_{n-1}$ | $dX_n$ | rX |
| Cycle n+1: CmpA | $dA_0$ | $dA_1$ | $dA_2$ | $dA_3$ | ... | $dA_{n-2}$ | $dA_{n-1}$ | $dA_n$ | rA |

350 — Known or inferred to be valid
351 — Expected state, but uncertain
353 — Known or inferred to be invalid

348

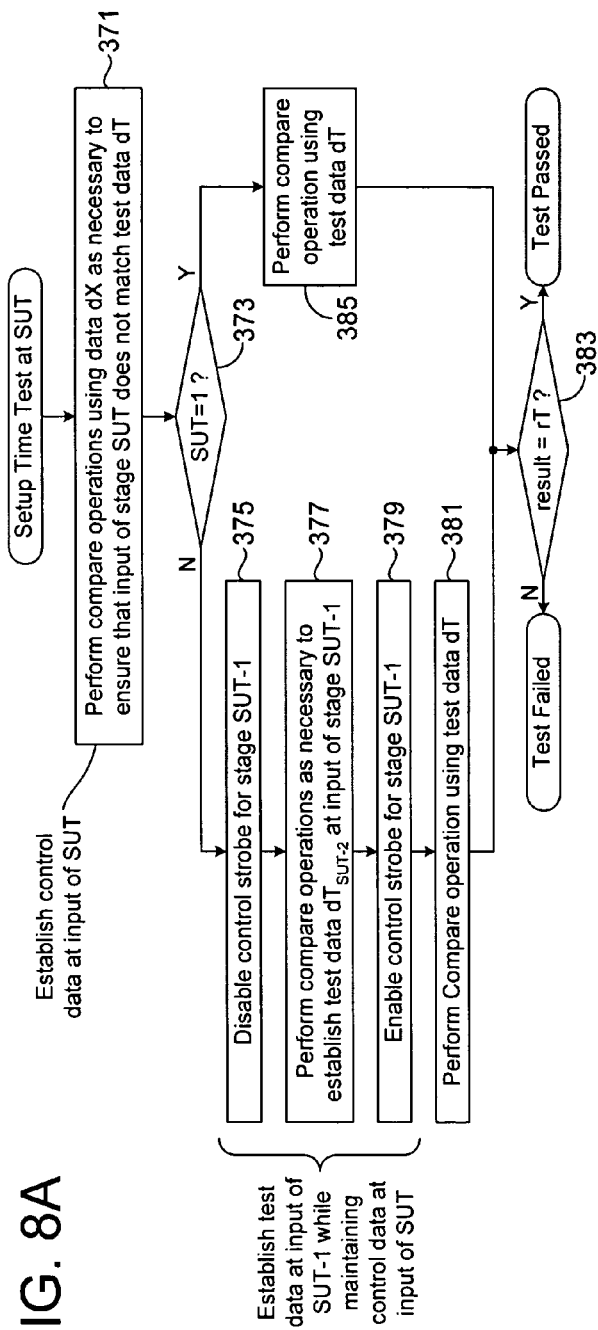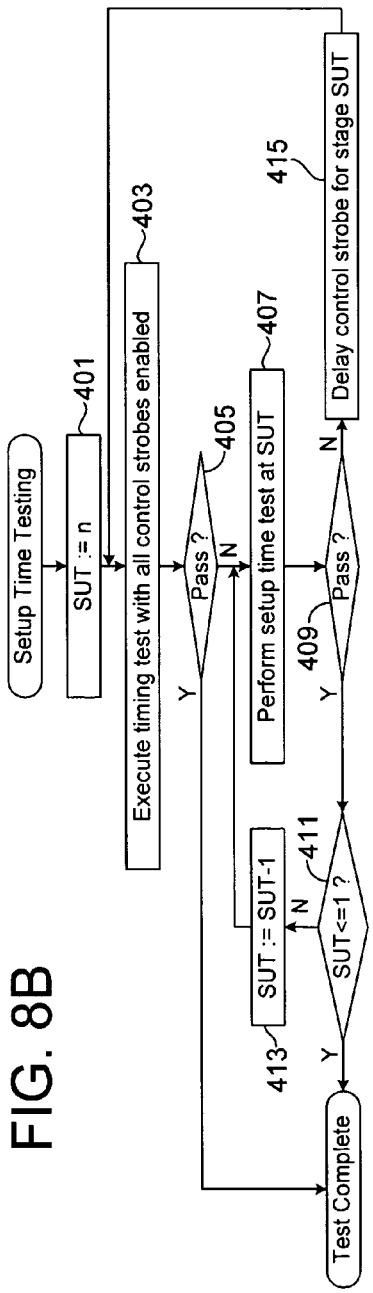
FIG. 8A
FIG. 8B

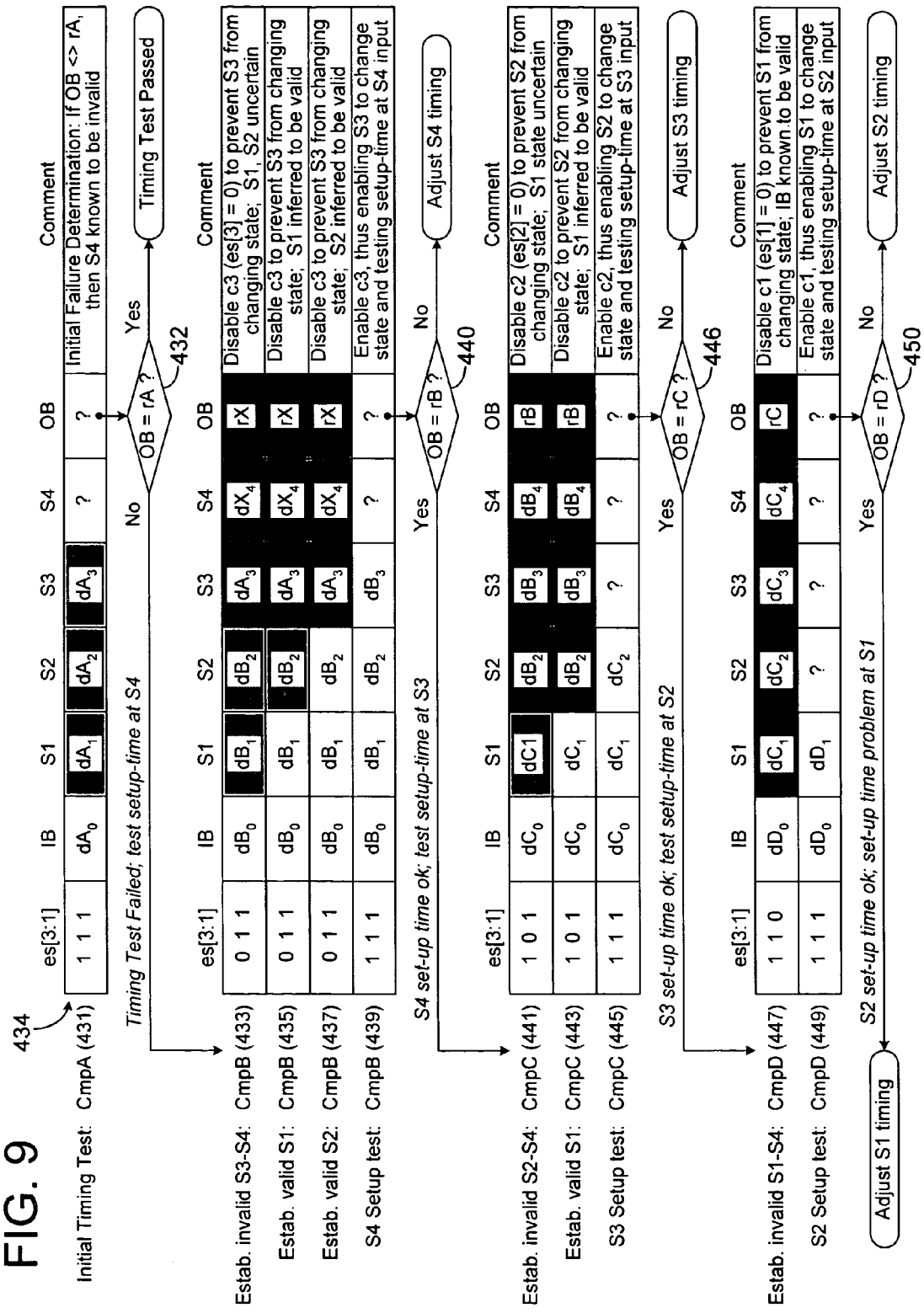

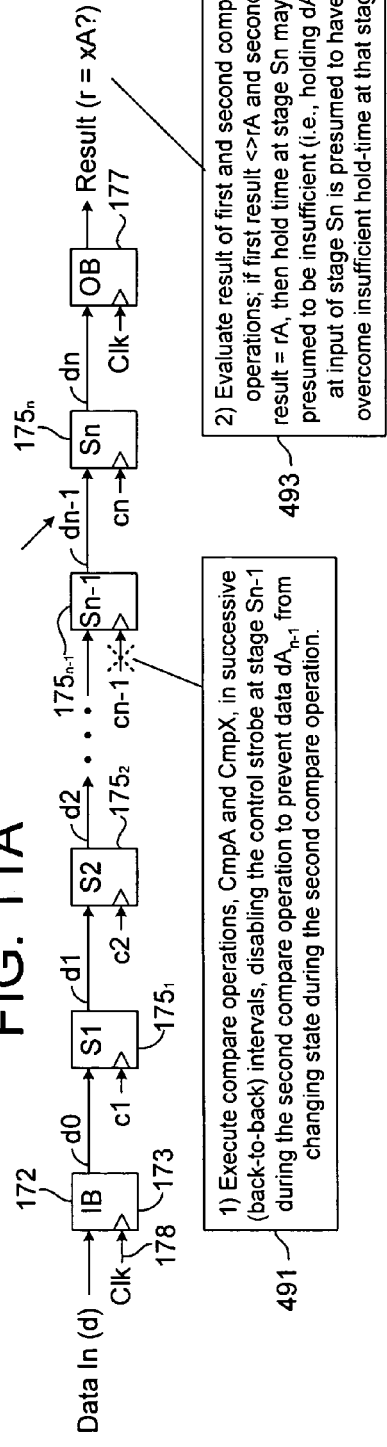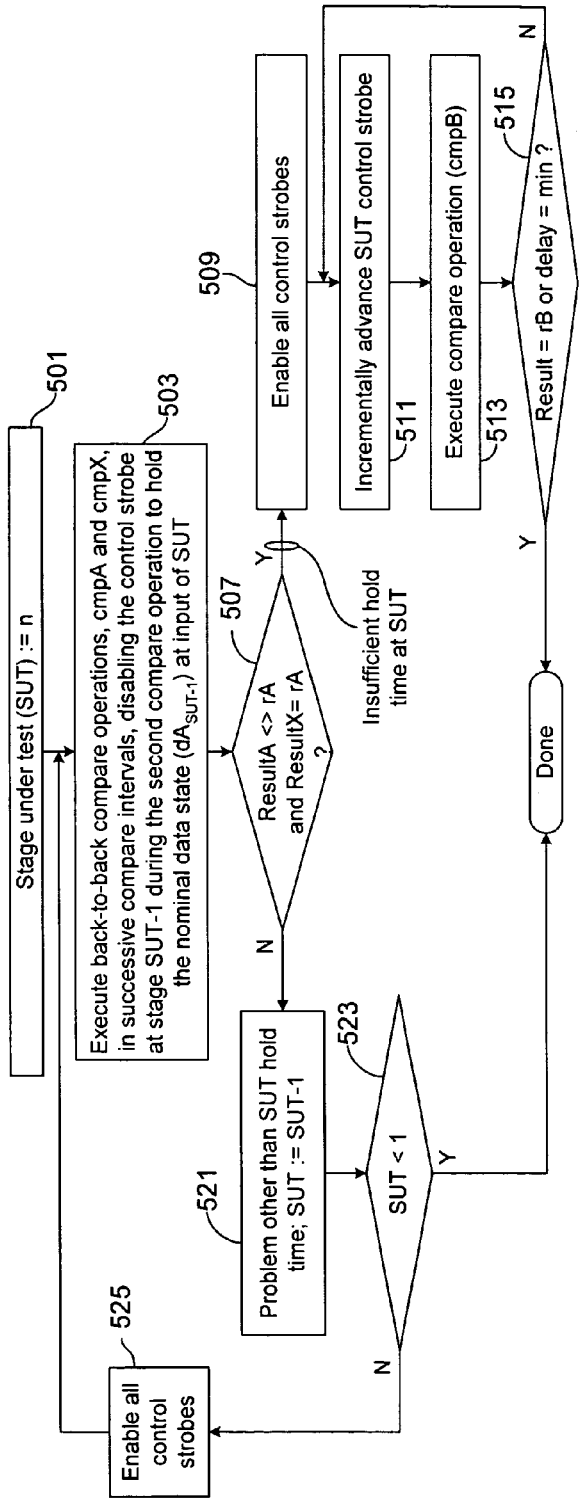

TIMING FAILURE ANALYSIS IN A SEMICONDUCTOR DEVICE HAVING A PIPELINED ARCHITECTURE

FIELD OF THE INVENTION

The present invention relates to semiconductor devices and more particularly to timing of pipelined operations therein.

BACKGROUND

Various timing verification strategies are used to ensure adequate setup and hold time between successive pipeline stages in a semiconductor device, with tolerances built in to account for process, voltage and temperature variations. As process geometries shrink and clock rates increase, timing margins go down, increasing the likelihood of timing-related failure. Unfortunately, determining the locus of a timing failure in a pipelined semiconductor device often involves guesswork as results generated by intermediate pipeline stages are generally not observable. Consequently, to avoid having to make multiple, piecemeal mask revisions to address timing-related failures, designers often elect to relax timing constraints for each suspected failure locus; a practice that may unnecessarily increase the overall pipeline latency.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3 illustrates an exemplary state of pipeline stages within the device of FIG. 1B after an instruction and corresponding data have been processed;

FIG. 5A illustrates an exemplary technique for identifying setup time failure at the output buffer of FIG. 1B;

FIG. 5B illustrates an exemplary technique for identifying setup-time failure at the input buffer of FIG. 1B;

FIG. 5C illustrates an exemplary technique for identifying hold-time failure at the input buffer of FIG. 1B;

FIG. 7 illustrates an extension of the repeated-operation technique to obtain a desired result in a device having insufficient setup time at multiple pipeline stages;

FIG. 8A illustrates a flow diagram of a setup-time test according to an embodiment that involves the control and trigger operations described in reference to FIG. 7;

FIG. 8B illustrates an exemplary approach to testing all the internal pipeline stages of a pipelined-architecture device through repeated execution of the setup-time test of FIG. 8A;

FIG. 9 illustrates an example of a setup-time test carried out in a pipelined semiconductor device in accordance with the embodiment of FIG. 8B;

FIG. 11A illustrates an approach to identifying a hold time failure at an internal pipeline stage according to one embodiment;

FIG. 11B illustrates stage-by-stage testing that may be performed in accordance with the embodiment of FIG. 11A to isolate a hold-time failure to the data transfer between a particular pair of internal pipeline stages;

DETAILED DESCRIPTION

Figure 1A:
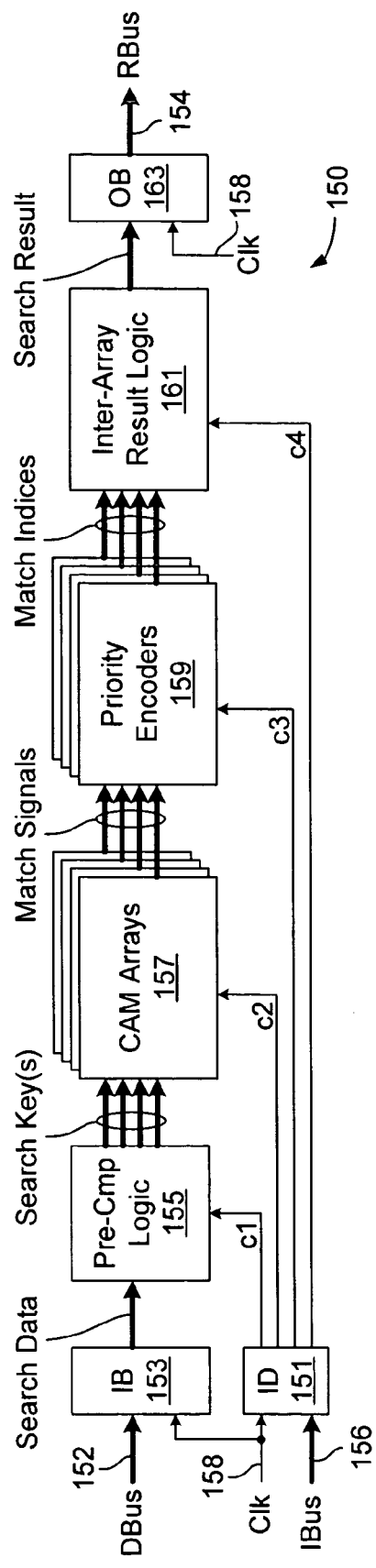
FIG. 1A illustrates an embodiment of a content addressable memory (CAM) device having programmable timing-control circuitry to enable data transfer between internal pipeline stages to be tested and, if necessary, to adjust the phase of timing signals used to effect the data transfer.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alteratively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. Also signals referred to herein as clock signals may alternatively be strobe signals or other signals that provide event timing.

With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as connections through one or more intermediary circuits or structures. The term "exemplary" is used herein to express an example, not a preference or requirement.

Semiconductor devices having circuitry for identifying timing failures and methods of operating and testing same are disclosed in various embodiments. In one embodiment, a semiconductor device having a pipelined architecture and timing circuitry for generating timing signals to initiate operations within various pipelined stages includes a programmable control circuit to enable one or more of the timing signals to be disabled during device testing operations. Through such facility, timing related failures may be isolated to the data transfer between a specific pair of pipeline stages, thereby eliminating guesswork traditionally associated with internal timing failure analysis, and enabling designers to adjust the phase of only those timing signals associated with the identified data transfer. Also, in one embodiment, phase-adjust circuitry is provided within or in connection with the programmable control circuit to enable the phase of timing signals used to initiate operation of each pipeline stage to be adjusted as necessary to establish reliable receipt of data from the preceding stage, thus permitting failures identified in the testing process to be corrected during device production or at system run time.

FIG. 1 illustrates an embodiment of a content addressable memory (CAM) device 150 having programmable timing-control circuitry to enable data transfer between internal pipeline stages to be tested and, if necessary, to adjust the phase of timing signals used to effect the data transfer. In the particular embodiment shown, the CAM device 150 has a number of pipelined logic stages including an input buffer 153 to receive search data from a data bus 152 (Dbus), precompare logic 155 to extract search keys from the search data (i.e., selecting particular bits or groups of bits within the search data and formatting the bits or groups of bits within desired bit locations within the search keys), CAM arrays 157 to store databases to be searched using the search keys, priority encoders 159 to receive search results (e.g., match signals) from the CAM arrays 157 and to generate corresponding match indices which indicate the location of search-key-matching entries within the CAM arrays 157, if any, and inter-array result logic 161 to generate a device-level match index (i.e., a final search result) from the match indices generated by the priority encoders and, finally, an output buffer 163 to store the search result and, at the appropriate time, output the device search result onto a result bus 154 (RBus). The CAM device 150 additionally includes an instruction decoder 151 to receive search instructions from an instruction bus 156 (IBus) and to generate, in response, control strobe signals c1-c4 to initiate operations within pipelined logic stages 155, 157, 159, 161, respectively (the "internal logic stages"), at the appropriate times. In one embodiment, the instruction decoder 151 is clocked, along with the input buffer 153 and output buffer 163 (the input and output buffers constituting external logic stages), by a clock signal 158 (Clk) which may be generated by a timing circuit (not shown) within the CAM device 150 or provided from an external source. For example, in one embodiment, the CAM device 150 includes a phase-locked loop (PLL) to generate the clock signal 158 in response to an externally generated reference clock signal, with clock signal 158 being a frequency multiple of the reference clock signal. In another embodiment, the CAM device 150 may include a delay-locked loop (DLL) or PLL to generate the clock signal 158 at the same frequency as, and desired phase relation ship to, an externally supplied reference clock signal. In other embodiments, an externally generated clock signal may be received by a clock buffer circuit (not shown) and provided to the instruction decoder 151 and external logic stages 153 and 163.

However generated, the clock signal 158 may be used within the instruction decoder 151 to generate the control strobe signals c1-c4 that are provided to the internal logic stages 155, 157, 159 and 161, respectively. In one embodiment, for example, the control strobe signals are delayed relative to an initial edge of the clock signal, referred to herein as the pipeline-start signal, by a time interval that corresponds to the amount of time expected for the result of the preceding stage to become valid. Embodiments of timing circuits for generating the control strobe signals are discussed below in greater detail.

The CAM device 150 of FIG. 1A has been particularly illustrated and described in emphasize the pipelined nature of search operations that may be carried out therein and may include numerous other circuit blocks and circuit interconnections that are not shown including, for example and without limitation, circuitry to enable read and write operations to the CAM arrays 157 as necessary for database installation and maintenance, error detection circuitry to detect and/or correct errors within the databases, configuration control circuitry to enable the operation of the various logic stages to be configured according to application needs, and so forth. Also, while the CAM device 150 has been described as having separate interfaces to data, instruction and result buses (152, 156 and 154), one or more of the interfaces may be eliminated and the corresponding signal received or transmitted in multiplexed fashion via the remaining interface or interfaces.

Figure 1B:
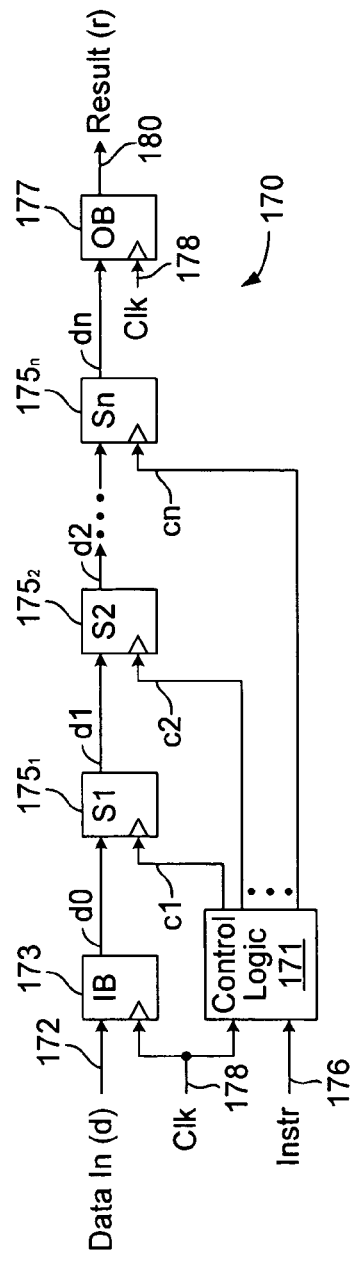
FIG. 1B illustrates an embodiment of a generalized device having a pipelined architecture that corresponds to the pipelined architecture of the CAM device of FIG. 1A.

FIG. 1B illustrates an embodiment of a generalized device 170 having a pipelined architecture that corresponds to the pipelined architecture of the CAM device 150 of FIG. 1A, and that may be used to implement virtually any type of pipelined operation including, but not limited to, the database searching operation described in reference to FIG. 1A. In the particular embodiment shown, the device 170 includes an input buffer 173 and output buffer 177 (external stages) that correspond to the input buffer 153 and output buffer 163 of FIG. 1A, as well as internal pipeline stages $175_1$-$175_n$ coupled in series between the input buffer 173 and output buffer 177. When used to implement a CAM device, the internal pipeline stages $175_1$-$175_n$ may include, for example, the pre-compare logic 155, CAM arrays 157, priority encoders 159 and inter-array result logic 161 of FIG. 1A. In other types of semiconductor devices, the internal pipeline stages may be used to perform virtually any type of operation on an incoming data value 172 (d), with each stage transforming the data (i.e., d0->d1, d1->d2, d2->. . . ->dn) as necessary to generate a final output result 180 (r).

Device 170 additionally includes a control logic circuit 171 to receive instructions 176 or other types of control signals and generates, in response, control strobe signals c1, c2, . . . , cn to initiate operations within each of the internal pipeline stages $175_1$-$175_n$, respectively. In one embodiment, the control logic 171 includes timing circuitry to generate the control strobe signals at particular instances in time relative to transitions of an internally or externally generated clock signal 178 (i.e., the clock signal 178 (Clk) being received or generated as discussed above in reference to FIG. 1A), and additionally includes phase-adjust circuitry to enable the phase of the control strobe signals to be adjusted as necessary to establish reliable data transfer between successive pipeline stages. In alternative embodiments, the phase-adjust circuitry may be omitted.

Figure 2:
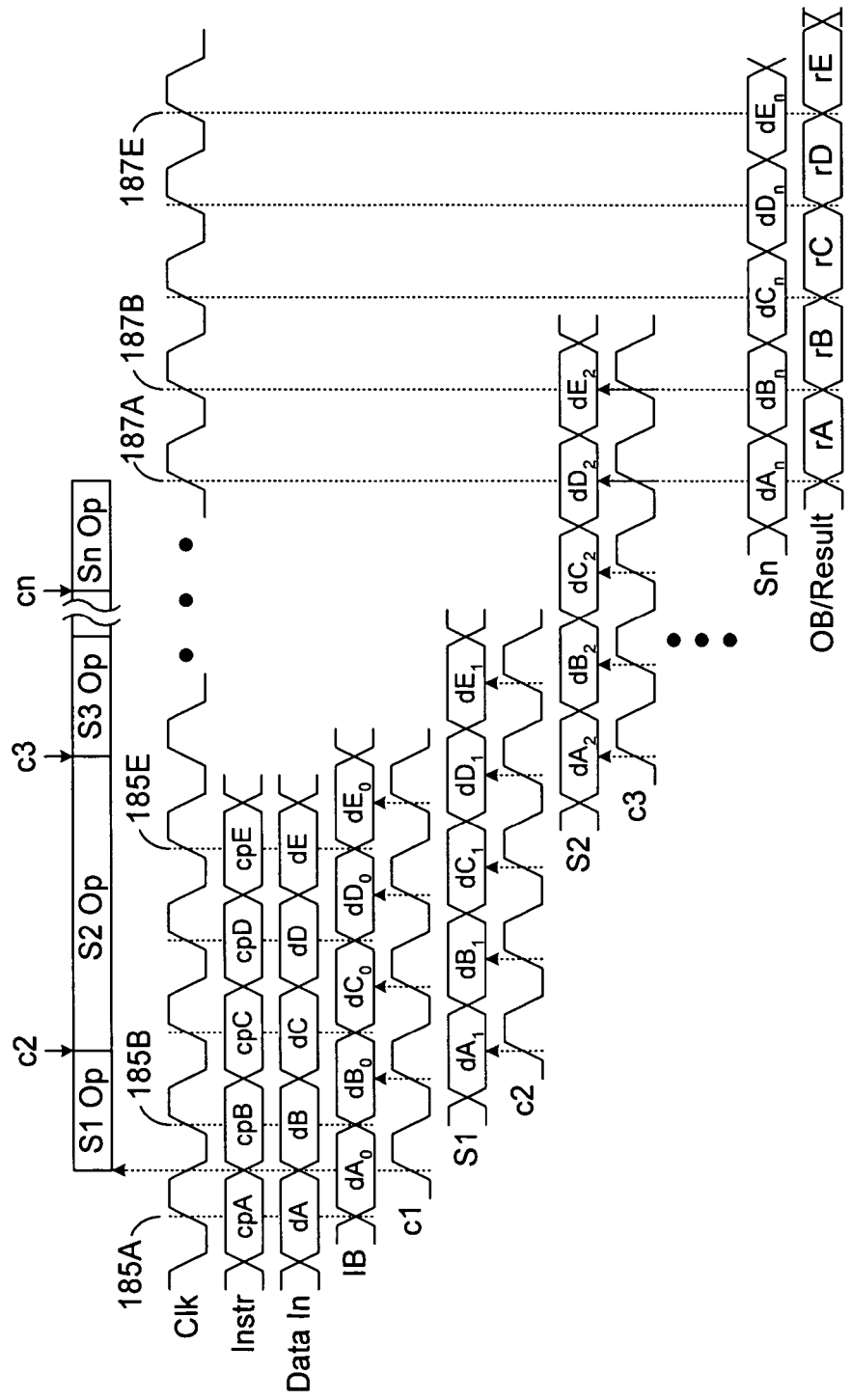
FIG. 2 is a timing diagram illustrating an exemplary sequence of pipelined operations that may be carried out within the device of FIG. 1B in response to incoming instructions and data.

FIG. 2 is a timing diagram illustrating an exemplary sequence of pipelined operations that may be carried out within the device 170 of FIG. 1B in response to incoming instructions and data. For purpose of description, the instructions and data are assumed herein to be compare instructions (cpA, cpB, . . . , cpE) and corresponding search data (dA, dB, . . . , dE) as might be received in a CAM device, though virtually any type of instruction and data may be received in alternative embodiments. In one embodiment, each incoming instruction and corresponding data is sampled in response to a rising edge of a clock signal (Clk), with new instruction and data being received in each clock cycle. Thus, compare instruction cpA and corresponding input data, dA, are sampled in response to the rising clock edge shown in 185A, compare instruction cpB and corresponding data dB are sampled in response to the rising clock edge shown at 185B and so forth to compare instruction cpE and corresponding data dE which are sampled in response to the rising clock edge shown at 185E. Each incoming data value is initially stored in the input buffer, IB, (i.e., captured or sampled in response to the indicated clock signal transition) and thereafter is applied in a series of data-transforming operations (S1 Op, S2 Op, S3 Op, . . . , Sn Op) within the internal pipeline stages, S1, S2, . . . Sn, before being strobed into the output buffer, OB, and then output as a result value. Thus, input data, dA, is latched within the input buffer as $dA_0$, then transformed to $dA_1$ through operation S1 Op of a first internal pipeline stage, S1. Similarly, data $dA_1$ is transformed to data $dA_2$ through operation S2 Op within a second internal pipeline stage, S2; data $dA_2$ is transformed to data $dA_3$ through operation S3 Op within a third internal pipeline stage, S3; and so forth to data $dA_{n-1}$ (not specifically shown) which is transformed to data $dA_n$ through operation Sn Op within a final internal pipeline stage, Sn. The output of final internal pipeline stage Sn is loaded into the output buffer in response to rising edge 187A of the clock signal and driven onto an external signal path. Input data values, dB, dC, dD and dE are transformed by the operation of the pipeline stages in the same manner as dA, with dB, dC, dD and dE being processed in a pipeline stage i-1, i-2, i-3 and i-4, respectively, while dA is processed in pipeline stage i (i, being an integer that indicates the current stage in which dA is being processed). By this operation, during a given clock cycle, each of the internal pipeline stages may operate concurrently on data generated from a respective input data value, thereby enabling a new result, rA, rB, rC, . . . to be output from the device in each clock cycle.

In one embodiment, each of the internal pipeline stages maintains a steady state output until a control strobe assertion indicates that a new data value is to be processed. Thus, as shown in FIG. 3, if compare instruction cpA and data dA are received within the device at time 190, and no further instructions and data are received thereafter (or at least for one or more clock cycles thereafter), then, if the system is operating properly, each of the pipeline stages will output a steady state data value that corresponds to the particular transformation of the data from the preceding stage (or, in the case of the first internal pipeline stage, the input buffer). That is, the input buffer will output steady-state vale $dA_0$, pipeline stage S1 will output a steady-state value, $dA_1$, pipeline stage S2 will output steady state value, $dA_2$ and so forth to pipeline stage Sn, which will output a steady-state value, $dA_n$ and the output buffer which will output a steady-stage value rA.

Figure 4A:
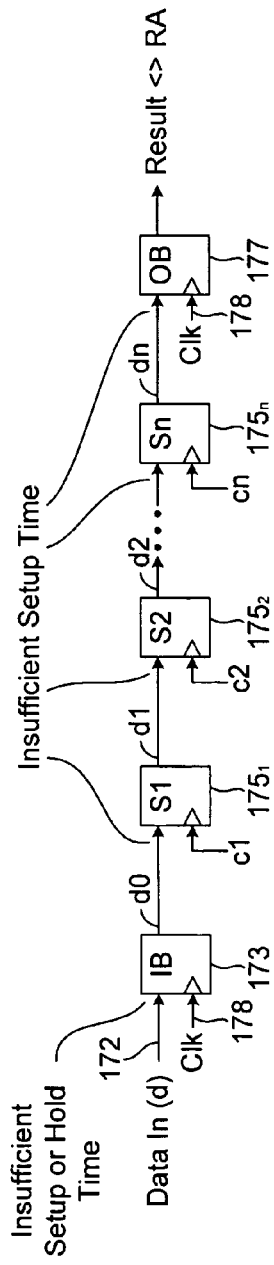
FIG. 4A illustrates timing failure modes that may occur within the device of FIG. 1B

If the result value that corresponds to a given data input, dA, does not match the expected value, rA, then, assuming that the functional logic within each of the pipeline stages has been confirmed to operate properly, a timing related failure may be inferred. More specifically, as shown in FIG. 4A, there may be insufficient data setup or hold time at the input to input buffer 173, and/or insufficient setup time for the data supplied to any of the internal pipeline stages $175_1$-$175_n$ or to output buffer 177. Note that, in the steady-state output arrangement illustrated in FIG. 4A, hold-time failure at the inputs of the internal pipeline stages $175_1$-$175_n$ and output buffer 177 may generally be ruled out by executing a single instruction without executing instructions in the immediately-following clock cycles. As shown in FIG. 4A, in that circumstance, the output of each pipeline stage, once valid, remains valid for an extended period of time, thus ensuring sufficient hold time for the data supplied to the internal pipeline stages $175_1$-$175_n$ and output buffer 177.

Figure 4B:
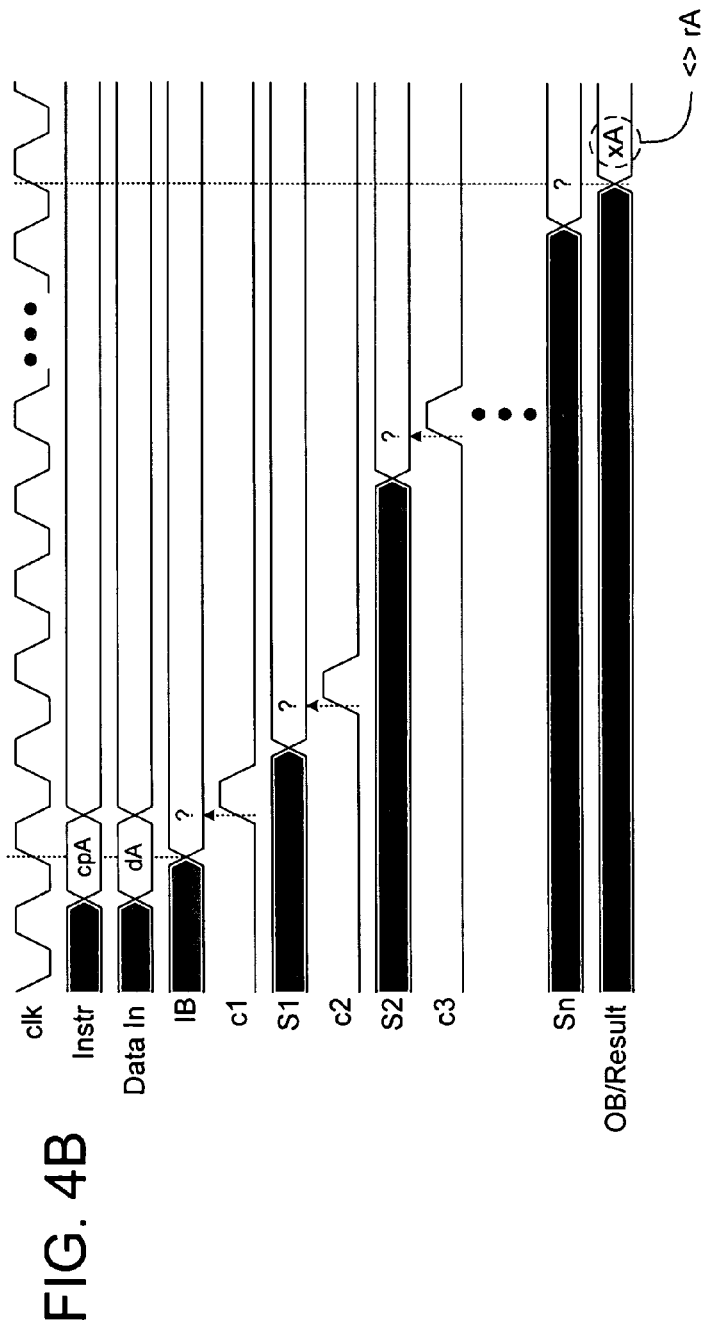
FIG. 4B illustrates the generally unknown state of the pipeline stages within the device of FIG. 1B if a timing related failure occurs.

Recalling that the actual data values generated by the internal stages may not be observable, the source of a timing-related failure may be in the data transfer to any one or more of the pipeline stages as shown in FIG. 4B. Because the input buffer 173 and output buffer 177 are clocked by a clock signal, setup time problems at the output buffer may be identified by evaluating the contents of the output buffer as shown in FIG. 5A, while setup and hold-time problems at the input buffer may be identified by manipulating the timing of input data relative to input instructions as shown in FIGS. 5B and 5C. More specifically, if an expected result, rA, is not generated at output cycle 200 (i.e., following clock edge 198) in response to a compare instruction, cpA, and corresponding data value, dA, captured in response to clock edge 196, then a setup time failure in the data transfer to the output buffer may be detected by evaluating the contents of the output buffer during output cycle 201 (i.e., the output cycle that immediately follows output cycle 200 and clock edge 199). That is, referring to FIG. 4A, because each of the pipeline stages will generate a steady-state output over an extended period, if the timing failure is a setup time failure at output buffer 177, then the steady-stage output of pipeline stage $175_n$ (Sn) will extend into the clock cycle that starts at edge 199, thus ensuring sufficient setup time to capture the rA result in output cycle 201. Accordingly, if the expected output result, rA, is captured in the output buffer one cycle late (determined in decision block 203), then insufficient setup-time in the output buffer may be inferred as shown at 205. In one embodiment, the output buffer (or other circuit block) may include circuitry for adjusting the time, relative to the clock edge 198, at which the output buffer 177 samples the output of the preceding pipeline stage, thus enabling the output buffer sampling time may be adjusted until the expected output result is captured in the proper clock cycle (i.e., clock cycle 200). Alternatively, the phasing of the clock signal itself may be adjusted until the output buffer 177 captures the desired result in clock cycle 200. In another alternative embodiment, the phasing of control strobe cn (and possibly other control strobes as necessary to maintain relative timing between internal pipeline stages) may be advanced to cause the output of internal pipeline stage, Sn ($175_n$), to become value earlier in time, thus increasing the setup time at the output buffer 177.

If the expected output result, rA, is not generated by the device in cycle 201, then another timing problem (or possibly an additional timing problem) exists which may include setup/hold-time failure at the input buffer and/or setup-time failure at an internal pipeline stage. Referring to FIG. 5B, setup-time failure at the input buffer may be detected by supplying input data, dA, one cycle in advance of the corresponding compare instruction; that is, in input cycle 211 instead of or in addition to input cycle 212. If the advancing the cycle in which input data, dA, is supplied yields the expected result in output cycle 200 (determined at decision block 217), insufficient input buffer setup time may be inferred as shown at 219. As with the output buffer, the input buffer may include circuitry for adjusting the input data sampling point until input data supplied at the desired time relative to clock edge 196 yields the expected output. Attentively, the phasing of the clock signal itself may be adjusted so long as the output buffer continues to capture the expected result at the desired clock edge. If advancing the data input does not yield the expected result (as determined at 217) either at output cycle 200 or shortly thereafter, then a problem other than input-buffer setup-time and output-buffer setup time exists, which problem may include input buffer hold time failure or setup time failure at one of the internal pipeline stages.

Referring to FIG. 5C, input-buffer hold-time failure may be detected by providing data one cycle after the cycle in which the corresponding compare instruction is received; that is, in input cycle 221 instead of or in addition to input cycle 212, thus effecting an extended hold-time at the input of the input buffer. If extending the data-hold time at the input buffer in this manner yields an expected result in output cycle 200 or shortly thereafter (as determined at decision block 225), then insufficient hold-time at the input buffer may be inferred as shown at 227. Accordingly, the phasing of the input buffer sampling point may be advanced relative to clock edge 196 or the clock phase may be delayed relative to the incoming data, dA, until data captured in response to clock edge 196 yields the desired output result. Note that the output buffer contents may be evaluated in decision blocks 217 and 225 to detect combinations of output-buffer/input-buffer timing failure.

Figure 6A:
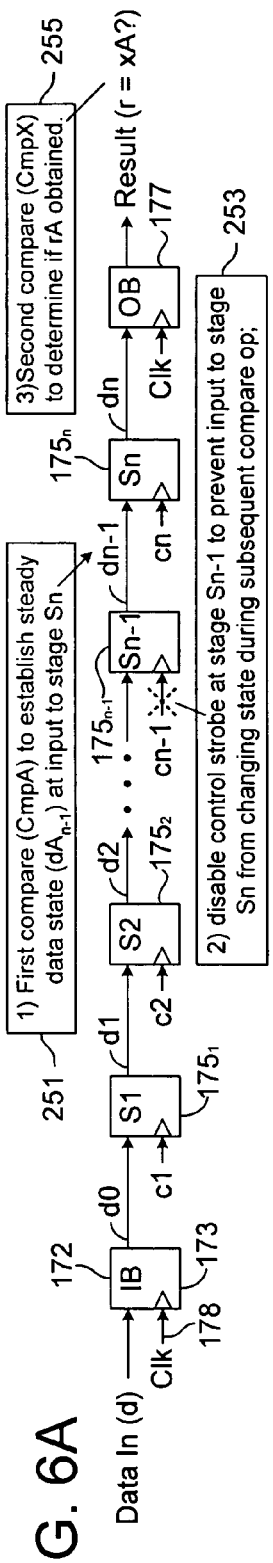
FIG. 6A illustrates an approach to identifying a setup time failure at an internal pipeline stage according to one embodiment.

Referring again to FIG. 4A, once proper data capture in the input buffer 173 and output buffer 177 have been established, any remaining problems may be assumed to result from setup-time failure at the input of one or more of internal pipeline stages $175_1$-$175_n$. As discussed, the outputs of the internal pipeline stages $175_1$-$175_n$ are generally not observable, making it difficult to determine the location of the timing failure. FIG. 6A illustrates an approach to identifying a setup time failure at an internal pipeline stage according to one embodiment. Supposing that the final internal pipeline stage, Sn, is the stage under test (SUT), a first compare operation is initiated with input data, dA, to establish a presumed, steady-state value, $dA_{n-1}$, at the input of stage Sn (251). Then, at 253, the control strobe signal cn-1 to the stage that precedes the stage under test is disabled (i.e., prevented from being asserted) to prevent the input to stage Sn from changing state during a subsequent compare operation. Thus, when a second compare operation is initiated with input data dX (i.e., CmpX as shown at 255), the disabled state of control signal cn-1 prevents the output of stage Sn-1 from changing, thereby maintaining $dA_{n-1}$ at the input of stage Sn. That is, $dA_{n-1}$ is maintained at the input of stage Sn over a period of time that extends from the time that $dA_{n-1}$ first becomes valid during the first compare operation (i.e., initiated in block 251) to the subsequent assertion of control signal cN the second compare operation initiated in block 255. Accordingly, if a setup-time failure prevented or corrupted the data transfer from stage Sn-1 to stage Sn during the first compare operation, the steady-state assertion of data $dA_{n-1}$ during the interval extending from the first compare operation to the assertion of control strobe cn during the second compare operation will ensure sufficient setup time for capture of data $dA_{n-1}$ in stage Sn, and thus yield the result, rA, initially expected in response to the first compare operation. Accordingly, if the second compare operation yields result, rA, it may be inferred that a data transfer failure between stages Sn-1 and Sn was overcome by the disabling of control signal cn-1 (and therefore extended assertion of data $dA_{n-1}$) and therefore that insufficient setup time exist at the input of state Sn. In an embodiment that includes circuitry for adjusting the phase of the control strobes, c1-cn, the phase of control strobe cn may be delayed as necessary to ensure that data from the preceding stage is present for a sufficient period of time to establish reliable data transfer.

Returning to the operation at block 255, if the second compare result yields a result other than rA, then a failure has occurred at another data transfer point in the pipeline. In that case, a new pipeline stage may be selected as the stage under test and the operations shown at FIG. 6A repeated.

Figure 6B:
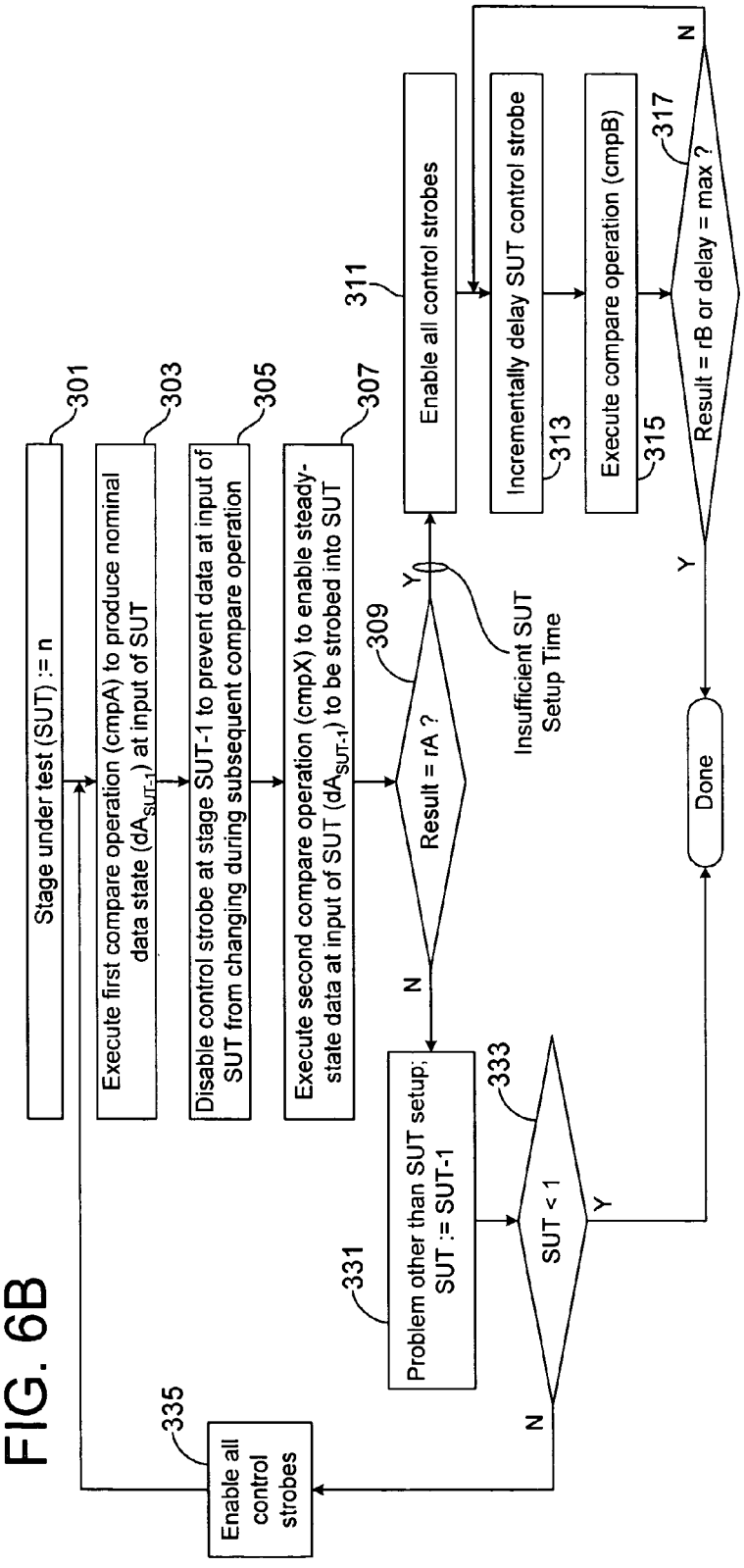
FIG. 6B illustrates stage-by-stage testing that may be performed in accordance with the embodiment of FIG. 6A to isolate a setup-time failure to the data transfer between a particular pair of internal pipeline stages.

FIG. 6B illustrates stage-by-stage testing that may be performed in accordance with the embodiment of FIG. 6A to isolate a setup-time failure to the data transfer between a particular pair of internal pipeline stags. In the particular embodiment shown, setup-time at the final internal pipeline stage is tested first so that, at block 301, a stage-under-test variable (SUT) is assigned an index that corresponds to final internal pipeline stage Sn. The internal pipeline stages may be tested in opposite or different order in alternative embodiments. At 303, a first compare operation, cmpA (denoting that a compare instruction, cpA, and corresponding data, dA, is supplied to the device), is executed to produce a nominal data state, $dA_{SUT-1}$ at the input of the internal pipeline stage under test (i.e., at the output of the internal pipeline stage, SUT-1, that precedes the stage under test). At 305, the control strobe to stage SUT-1 (i.e., $c_{SUT-1}$) is disabled to prevent the data state at the input of the stage under test from changing state during a subsequent compare operation. Then, at 307, a second compare operation (cmpX) is performed to enable the steady-state data output from stage SUT-1 to be strobed into the stage under test. If an incorrect result was obtained in the first compare operation due to setup-time failure at the stage under test, then the second compare operation should yield a result, rA, that corresponds to the data, dA, provided in the first compare operation. Thus, the result of the second compare operation is evaluated at decision block 309. If result rA has been obtained, insufficient data setup time at the stage under test is presumed. Accordingly, in an embodiment having circuitry to adjust the phase of the control strobes supplied to the internal pipeline stages, the operations shown at 311-317 may be undertaken to incrementally delay the control strobe supplied to the stage under test until reliable operation is achieved or until the control strobe has been delayed to a maximum degree without correcting for the presumed failure. More specifically, at 311, all control strobes are enabled in preparation for a control strobe adjustment operation. At 313, the control strobe for the stage under test is incrementally delayed and, at 315, a compare operation using different data than had been previously applied (e.g., cmpB meaning compare instruction, cpB, with data, dB) is executed. At decision block 317, the result of the compare operation is evaluated to determine if the expected data has been received (i.e, rB in the first iteration through blocks 313-317). If so, then the control strobe setting may be recorded, for example, in a one-time programming operation within the semiconductor device (e.g., in a non-volatile memory or fuse-blowing operation) or may be recorded in a non-volatile storage (e.g., a boot-up read-only-memory (ROM) such as a basic input/output services (BIOS) storage) for run-time retrieval and programming within a volatile configuration register of the semiconductor device.

If, at decision block 317, the expected result is not obtained, the operations of blocks 313 and 315 are repeated (with yet different data applied in the compare operation at block 315) and the result evaluated again at decision block 317. If, after iterating through operations 311, 313 and 317 a sufficient number of times to reach a maximum control strobe delay setting, the expected result is still not received, the timing failure may be deemed irreparable and the device discarded or marked for repair.

Returning to decision block 309, if the expected result (rA) is not obtained, then a setup time problem exist at a stage other than the stage under test (note that a problem may still exist at the stage under test but, for present purposes, a single-mode failure is assumed). Accordingly, at block 331, the stage-under-test variable (SUT) is decremented to select the preceding internal pipeline stage as the stage under test. If SUT is less than one (determined at decision block 333), then all stages have been tested without achieving the desired result and therefore without isolating the problem to a single-point of failure. In that circumstance a multi-point failure may be assumed. In one embodiment, a multi-point failure test, discussed below, may be carried out to identify the failure locations. Alternatively, the part may be discarded or marked for repair. If all stages have not been tested (i.e., SUT determined to be greater than or equal to one at decision block 333), then all control strobes are enabled to block 335 in preparation for a repetition of the operations at blocks 303, 305 and 307 for the newly selected stage under test. By this operation, the setup-time at each of the internal pipeline stages may be extended to determine if the input to a given stage is the source of timing failure.

Returning to the phase adjust operation at block 313, it should be noted that, when such phase adjust operation is being performed on the control strobe for a stage other than the last stage, it may be desirable to additionally adjust the phase of the control strobe for each downstream pipeline stage (including the phasing of the sampling time in the output buffer), to compensate for the phase shift in the output-valid time for the stage under test.

As discussed in reference to FIG. 3, in some embodiments the output of each internal pipeline stage remains unchanged until a subsequent pipelined operation is initiated. Consequently, if a single-point setup time failure occurs, a repetition of the same operation and input data should produce the correct output. Referring to FIG. 4, for example, if a setup-time failure occurs at the input of stage S2 during a first compare operation using data, dA, then the output of stage S1 should have stage $dA_1$. Thus, in a second compare operation also applying data, dA, the output of stage S1 will remain unchanged, thus ensuring that $dA_1$ is present at the input of stage S2 for an extended period of time; well in advance of the time that the input to stage S2 would ordinarily become valid and sufficient to meet the next-stage setup time requirement. Consequently, the repetition of a compare operation using the same data should overcome the setup time failure at the input of stage S2 and thus yield the correct result, rA, at the device output.

FIG. 7 illustrates an extension of the repeated-operation technique to obtain a desired result in a device having as many as n setup time failures at n internal pipeline stages. That is, assuming that data capture operations in the output buffer and input buffer are properly timed (confirmed, for example, using the testing techniques described in reference to FIGS. 5A-5C), and that setup time failures are occurring at the inputs of some number and possibly all of the internal pipeline stages, then after a first compare operation using data, dA, (i.e., a CmpA operation), the condition of the input buffer (IB), output buffer (OB) and internal pipeline stages S1-Sn may be as shown in the first row of table 348 (i.e., the row that corresponds to compare cycle 1). As shown in the legend to the right of table 348, the data state at the output of pipeline stages designated by unshaded boxes is known or inferred to be valid; the data state at the output of stages designated by lightly shaded boxed is expected to have the value shown, but is uncertain; and the data output at stages designated by darkly shaded boxes is known or inferred to be invalid. Thus, assuming that proper data-capture timing at the input buffer and output buffer have been established, then after compare cycle 1, the input buffer may be inferred to have a valid output, $dA_0$ (no shading) and the output buffer is known to have an invalid output, rX (dark shading). Because proper data-capture timing at the output buffer has been established, the output of the final internal pipeline stage, Sn, may be inferred to be invalid and have state $dX_n$ (dark shading). The outputs of the remaining input stages, S1-Sn-1 is uncertain, but expected to be $dA_1$-$dA_{n-1}$ as shown.

If, in compare cycle 2, a second compare operation using data dA also yields an incorrect result (i.e., rX or any other output that does not match rA), then the inferences regarding the states of all pipeline stages remains the same except that, due to the known (or inferred) steady state of $dA_0$ at the input of stage S1 over a period of two compare cycles, any setup-time failure at state S1 should have been overcome so that the output of stage S1 may be inferred to be value and equal to $dA_1$. Similarly, if, in compare cycle 3, a third compare operation using dA yields an incorrect result then, due to the inferred steady state of $dA_1$ over at least two compare cycles, any setup-time failure at stage S2 should have been overcome so that the output of stage S2 may be inferred, after compare cycle 3, to be valid and equal to $dA_2$. Proceeding in this fashion, if setup time failures exist at the input of each of the n internal pipeline stages, then after n-1 compare cycles using data, dA, the output of stage Sn-2 may be inferred to be valid (along with the outputs of all preceding stages) and equal to $dA_{n-2}$; after n compare cycles applying dA, the output of stage Sn-1 may be inferred to be value and equal to $dA_{n-1}$; and after n+1 compare cycle using dA, the output of stage Sn should become valid ($dA_n$) and thus yield the desired output result rA. If the desired output result does not occur after n+1 compare cycles using the same data, it may be concluded that the device is experiencing a failure other than setup-time failure at the internal pipeline stages.

Reflecting on FIG. 7, a number of observations may be made regarding timing failure analysis. First, the number of internal pipeline stages experiencing setup time failure may be determined (or at least inferred or deduced) from the number of same-data compare operations needed to obtain a correct result in the output buffer. If a single repetition of the compare operation yields a correct result, for example, a single-point failure may be assumed and the testing strategy described in reference to FIGS. 6A and 6B employed to identify the failure point and, in an embodiment having phase-adjust circuitry, adjust the phase of one or more control strobe signals as necessary to correct the timing failure.

Another observation regarding FIG. 7 is that a known or inferred data state may be established at the input of a given internal pipeline stage through repetition of same-data compare operations. Such operation becomes particularly useful when combined with the ability to disable the control strobe at the same internal pipeline stage, as a known (or inferred) test data state may be established at the input of a pipeline stage, referred to herein as a control stage, that precedes a stage under test without affecting the input data to the stage under test. That is, assuming all internal pipeline stages downstream from a stage under test have been confirmed to have sufficient setup time, then by disabling the control strobe for the control stage (the stage that precedes the stage under test) and repeating a sufficient number of same-data compare operations, a desired test data state may be established at the input of the control stage while a different unrelated value is present at the output of the control stage (and therefore at the input of the stage under test). Once such a test data state is established at the input and output of the control stage, a setup-time test directed to the stage under test may be armed by re-enabling the control strobe for the control stage. After the setup-time test is armed, a setup-time test may be triggered by issuing a final compare instruction using the same input data that was used to establish the test data state, thus causing the control of the control stage to change state. If the setup time is sufficient at the state under test, the new data state at the output of the control stage (i.e., data output from the control stage will transition in accordance with the test data input when the corresponding control strobe is asserted) will be captured in the stage under test and the output of the stage under test will correspond to the test data. In that case, assuming that the proper setup time for the subsequent stages has been established, the final compare operation should yield a valid, expected result at the output buffer. If the expected result is not captured in the output buffer, then a setup-time failure at the input of the stage under test may be presumed and, if control strobe phase-adjust circuitry is provided, corrected through adjustment of the phase control strobe for the stage under test.

FIG. 8A illustrates a flow diagram of a setup-time test according to an embodiment that involves the control and trigger operations described above. More specifically, at 371, compare operations are repeated as necessary using control data dX to ensure that the data input to the stage under test does not match test data dT to be applied in subsequent compare operations. If the stage under test is not the first internal pipeline stage (i.e., SUT=1, as determined in decision block 373), test data is establishes at the input of the control stage (i.e., the pipeline stage that feeds the stage under test) while maintaining the control data $dX_{SUT-1}$ at the input of the stage under test. That is, at 375 the control strobe for the stage under test is disabled. At 377, compare operations are performed as necessary using test data dT to establish test data state, $dT_{SUT-2}$, at the input of the control stage, and at 379, the control strobe for the control stage is enabled to arm the setup-time test.

At 381, a compare operation using test data dT is initiated to trigger a setup-time test at the stage under test. The result of the compare operation is evaluated at decision block 383. If the expected result, rT, is obtained (i.e., test passed), then the setup-time at the stage under test is sufficient. If any other result is obtained, a setup time failure at the stage under test is presumed (i.e., assuming sufficient setup time has been established at all downstream pipeline stages) and, if circuitry for adjusting the phase of the control strobe to the stage under test is provided, the phase of the control strobe (and, if necessary, control strobes for downstream stages) may be adjusted as necessary to establish sufficient setup time at the stage under test.

Returning to decision block 373, if the stage under test is the first internal pipeline stage (i.e., SUT=1), then a compare operation using test data dT may be executed to determine whether the setup time at the first internal pipeline stage is sufficient.

FIG. 8B illustrates an exemplary approach to testing all the internal pipeline stages of a pipeline-architecture device through repeated execution of the setup-time test of FIG. 8A. At 401, a stage-under-test variable (SUT) is assigned an index that corresponds to final internal pipeline stage Sn (i.e., SUT: =n). At 403, a compare operation is executed with all strobes enabled to determine whether a setup-time problem exists at all. If the expected result is received (i.e., test result=Pass, as determined in decision block 405), then the part is operating properly and setup-time testing is deemed complete. If the expected result is not received, then a timing failure is presumed and the setup-time test of FIG. 8A is executed at 407 to determine whether the setup time at the stage under test is sufficient. If the setup time at the stage under test is determined to be sufficient (i.e., setup-time test passed as determined at decision block 409), then, if the stage under test is not the first internal pipeline stage (i.e., SUT is greater than one as shown at decision block 411), the stage-under-test variable is decremented at 413 to select the preceding pipeline stage to be tested in another setup-time test at 407.

Returning to decision block 409, if the device fails the setup-time test performed at 407, then the phase of the control strobe for the stage under test is delayed in block 415, and the device-level timing test at block 403 repeated to determine if the control strobe phase adjustment yields proper overall operation of the device. That is, if the device passes the test at block 403, setup-time testing is deemed complete, and if not, the operations starting at block 407 are repeated to determine if the stage under test continues to exhibit setup time failure and, if so, to delay the corresponding control strobe further. As in the control strobe adjustment operation in FIG. 6B, if the control strobe for the stage under test is delayed by a maximum amount without connecting the SUT setup time failure, the device may be deemed to have failed overall setup-time testing and may be discarded, marked for repair, or binned as a slower operating frequency part (in which case further testing may be carried out at the slower operating frequency). Also, as discussed above, when the control strobe for the stage under test is delayed, it may be desirable to delay all control strobes for downstream pipeline stages to ensure that the relative timing of those stages remains the same.

If block 411 is reached for the first internal pipeline stage (i.e., SUT=1), then it may be concluded that some other failure mode is present in the device, else the device should have passed the test at block 403. Accordingly, upon reaching block 411 with the first internal pipeline stage as the stage under test, the device may be discarded, or marked for repair and/or further testing.

FIG. 9 illustrates an example of a setup-time test carried out in a pipelined semiconductor device in accordance with the embodiment FIG. 8B. For clarity of explanation, a semiconductor device having four internal pipeline stages (S1-S4) is assumed, though more or fewer pipeline stages (or a configurable number of pipeline stages) may be provided in alternative embodiments. Initially, a compare operation 431 is performed to determine whether a timing related failure exists in the device. More specifically, a compare operation (or other type of pipelined operation) using data dA is executed to determine if an expected output result, rA, is obtained. Enable signals, es[3:1], which are used to enable and disable the control strobes supplied to internal pipeline stages S1-S3, respectively, are st to an enable state (i.e., logic '1' in this example) prior to or during the compare operation 431 to enable assertion of the corresponding control strobes and thus enable each internal pipeline stage to capture and process eh data output from the preceding pipeline stage. Consequently, if no setup time problems exist in the device, the expected result, rA, should be captured in the output buffer and the timing test deemed passed. This circumstance is shown by the affirmative branch leading from decision block 432. If the expected value is not captured in the output buffer, then a timing-related failure may be inferred, particularly if proper operation of the individual pipeline stages have already been verified.

Assuming that the initial timing test uncovers a timing-related failure, then the state of the input buffer (IB) and stages S1-S3 may be as shown at in the pipeline state diagram 434 (i.e., a diagram of pipeline data states that results from compare operation 431). That is, following the shading convention of FIG. 7, the input buffer may be inferred to output $dA_0$, and stages S1-S3 are expected, but not confirmed to output $dA_1$-$dA_3$, respectively. As shown in the comment field of the pipeline state diagram 434, if the content of the output buffer is not the expected value, rA, then the content of the output buffer is known to be invalid and, therefore, the content of the final internal pipeline stage may be inferred to be invalid. In that case, the negative branch of decision block 432 is followed with compare operations 433, 435, 437 performed in sequence with the same input data (dB) and with the control strobe signal for stage S3 disabled (i.e., es[3:1]=011], thus preventing the output of the control stage (S3) from changing state) to establish a known test data state, $dB_2$, at the input of stage S3. That is, as shown in the corresponding comment field of the pipeline state diagram that corresponds to compare operation 433, after the compare operation is complete, $dB_0$ is known to be captured within the input buffer, while $dB_1$ and $dB_2$ are expected, but unconfirmed at the outputs of stages S1 and S2. The output of stage S3 is known to be invalid by virtue of the disabled control strobe which isolates $dA_3$ or whatever value was generated by stage S3 in the preceding compare operation 431 at the S3 output (note that the cmpA operation may be repeated as necessary to ensure that the output of S3 does not, by happenstance, correspond to the test data, dB, loaded in compare operations 433, 435, 437). Similarly, the output of stage S4 is known to be invalid at $dX_4$ in accordance with the output result rX (i.e., some value other than rA) detected in the output buffer at decision block 432. After a second cmpB operation 435 with the control strobe for S3 disabled, S1 may be inferred to output a valid $dB_1$ value, while the output of S2 remains uncertain. After a third cmpB operation 437 with the control strobe for S3 disabled, S2 may be inferred to output a valid $dB_2$ value. At this point, the output of stages S3 and S4 and the output buffer remain in a known or invalid state. Accordingly, when the S3 control strobe is enabled for a subsequent compare operation 439 using data dB (i.e., es[3:1]=111), the output of S3 is enabled to change state, thus testing the setup time at the input of stage S4. Accordingly, after the setup-time test effected by compare operation 439, the output buffer may be evaluated at decision block 440 to determine if the expected result, rB has been captured. If rB has not been captured, then a setup time failure at the input of stage S4 has been detected, and the phase of the S4 control strobe may be adjusted as necessary to establish reliable data capture in that stage. After establishing reliable data transfer between S3 and S4, the overall timing test at 431 may optionally be repeated to determine if other timing failures remain. If additional timing failures are detected, or if such overall timing test is skipped, operation may proceed along the affirmative branch of decision block 440 to perform a setup-time test at stage S3. Similarly, if the expected result is captured in the output buffer for the S4 setup-time test, then the S4 setup time is sufficient and the affirmative branch of decision block 440 taken to check for setup-time failure at the input of stage S3.

The S3 setup-time test begins with a first compare operation 441 using data dC (i.e., cmpC) and with the control strobe for stage S2 disabled (i.e., es[3:1]=101). By this operation, a known data state, $dC_0$, is established at the output of the input buffer, and an expected, but unconfirmed data state, $dC_1$, is generated at the output of stage S1, while the outputs of stages S2-S4 and the output buffer remain in known, invalid states at $dB_2$, $dB_3$, $dB_4$ and rB, respectively. After a second cmpC operation 443 with the S2 control strobe disabled, a valid $dC_1$ output at stage S1 may be inferred, while the outputs of stages S2-S4 and the output buffer remain invalid. Because the output of stage S1 is inferred to be valid, and the input to stage S3 is known to be invalid, conditions are set for a setup-time test for stage S3. Accordingly, a third cmpC operation 445 is performed, this time with the S2 control strobe enabled, to enable the output of S2 to transition from $dB_2$ to $dC_2$, thereby effecting a setup-time test for stage S3. After the third cmpC operation 445 is completed, the output buffer is evaluated in decision block 446 to determine if the expected result, rC has been captured. If not, then a setup time failure at the input of stage S3 has been detected, and the phase of the S3 control strobe adjusted as necessary to establish reliable data capture in that stage. After establishing reliable data transfer between S2 and S3, the overall timing test 431 may optionally be repeated to determine if other timing failures remain. If additional timing failures remain, or if such overall timing test is skipped, operation may proceed along the affirmative branch of decision block 446 to perform a setup-time test at stage S2. Similarly, if the expected result is captured in the output buffer for the S3 setup-time test, then the S3 setup time is sufficient and the affirmative branch of decision block 446 is taken to check for setup-time failure at the input of stage S2.

The S2 setup-time test beings with first compare operation 447 using data dD (i.e., cmpD) and with the control strobe for stage S1 disabled (i.e., es[3:1]=110). By this operation, a known data stage, $dD_0$, is established at the output of the input buffer, while the outputs of stages S1-S4 and the output buffer remain in a known, invalid states at $dC_1$, $dC_2$, $dC_3$, $dC_4$ and rC, respectively. Because the output of input buffer is known (or inferred) to be valid, and the input to stage S2 is known to be invalid, conditions are set for a setup-time test for stage S2. Accordingly, a second cmpD operation 449 is performed, this time with the S1 control strobe enabled, to enable the output of S1 to transition from $dC_1$ to $dD_1$, therby effecting a setup-time test for stage S2. After compare operation 449 is complete, the output buffer may be evaluated at decision block 450 to determine if the expected result, rD has been captured. If not, then a setup time failure at the input of stage S2 has been detected, and the phase of the S2 control strobe adjusted as necessary to establish reliable data capture in that stage. After establishing reliable data transfer between S1 and S2, the overall timing test 431 may optionally be repeated to determine if further timing failures remain. If further timing failure is detected, the failure may deemed, by process of elimination, to be insufficient setup time at the input of stage S1, and the phase of the S1 control strobe adjusted as necessary to establish reliable S1 data capture. After establishing reliable data transfer between the input buffer and S1, the overall timing test at 431 may be repeated to determine if further failures remain. If the device still does not generate a correct result then, because failure in stage-to-stage data transfer has been ruled out, the failure may be deemed to reside within the logic of one or more of the pipeline stages or elsewhere in the device. In that case the part may be marked for further test or discarded.

Figure 10:
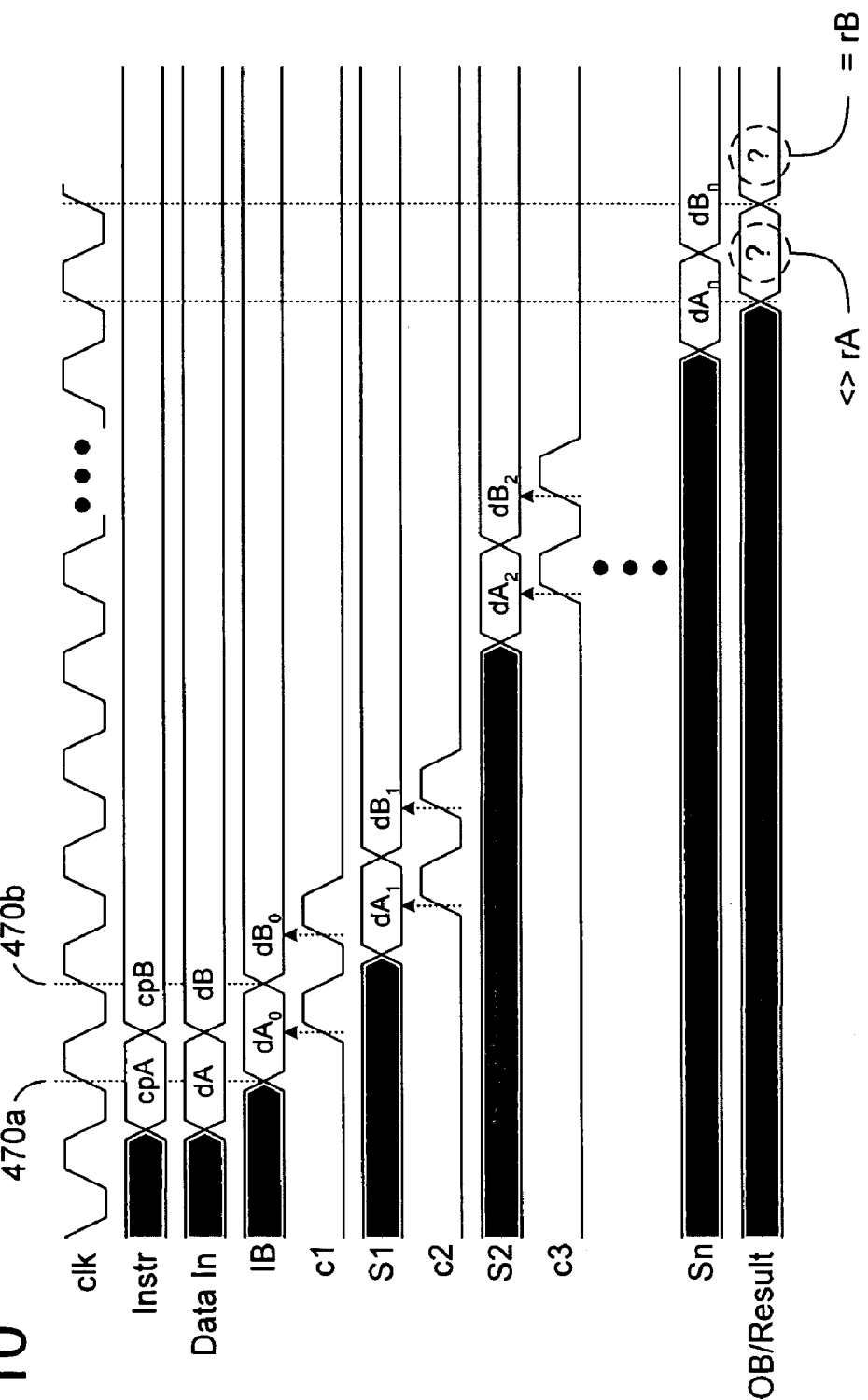
FIG. 10 illustrates a general approach to detecting hold-time failure in a pipelined semiconductor device according to one embodiment.

Although testing of internal pipeline stages has thus far focused on setup time failure, hold-time failures are also possible. FIG. 10 illustrates an approach used in a number of embodiments herein to determine if a hold-time failure exists. As shown, compare operations cmpA and cmpB (i.e., instruction/data cpA/dA and cpB/dB) and are executed in back-to-back compare intervals. Because one operation immediately follows the other through the pipeline stages S1-Sn, any hold-time failure at the input of a given stage will be result in failure to generate the expected result, rA followed by capture of expected result rB. That is, if hold-time is insufficient at a pipeline stage input, the second of the back-to-back compare operations will expose the failure by changing the data state at the input of the pipeline stage before the data is captured. By contrast, the second of the compare operations, cmpB should generate the expected result as the output of each stage is held indefinitely.

FIG. 11A illustrates an approach to identifying a hold time failure at an internal pipeline stage according to one embodiment. Supposing that the final internal pipeline stage, Sn, is the stage under test (SUT), then at 491 compare operations cmpA and cmpX are executed in successive (i.e., back-to-back) intervals, with the control strobe at the stage that precedes the stage under test (i.e., Sn-1) being disabled during or prior to the second computer operation to prevent data $dA_{n-1}$ from changing state during the second compare operation. By this operation, the stage under test is ensured to receive data $dA_{n-1}$ over an extended interval (i.e., starting from the time $dA_{n-1}$ becomes valid during the first compare operation and extending into the time during which $dX_{n-1}$ would have become valid but for the disabled control strobe). Accordingly, the result of the first and second compare operations is evaluated at 493 to determine if 1) the result of the first compare operation does not match rA (i.e., the expected result), and 2) the result of the second compare operation does match rA. If so, then the hold time at the stage under test may be presumed to be insufficient as the non-expected result of the first compare operation indicates a failure at some stage of the pipeline and the rA result obtained in the second compare operation indicated that holding $dA_{n-1}$ at the input of stage Sn over an extended period overcame the hold-time failure.

Still referring to FIG. 11A, it should be noted that disabling the compare strobe for a given pipeline stage at the desired time during back-to-back compare operations may be effected through an externally supplied signal (e.g., one or more input pins or other input structures may be provided to receive external enable signals), through probe points during wafer probe testing, through instruction encoding (e.g., the operation code or operand associated with a given instruction may indicate the control strobes to be disabled during the corresponding operation), or through configuration programming (e.g., programming a test register to disable a desired control strobe during the first or second of two operations). More generally, any technique for selectively enabling control strobes for the various pipeline stages may be used in alternative embodiments.

FIG. 11B illustrates stage-by-stage testing that may be performed in accordance with the embodiment of FIG. 11A to isolate a hold-time failure to the data transfer between a particular pair of internal pipeline stages. In the particular embodiment shown, hold time at the final internal pipeline stage is tested first so that, at block 501, a stage-under-test variable (SUT) is assigned an index that corresponds to final internal pipeline stage Sn. The internal pipeline stages may be tested in opposite or different order in alternative embodiments. At 503, back-to-back compare operations, cmpA and cmpX, are executed, with the control strobe for stage SUT-1 being disabled during the second compare operation to hold nominal data state $dA_{SUT-1}$ at the input of the stage under test. The results of the two compare operations, resultA and resultX, are evaluated in decision block 507 to determine if 1) resultA is not equal to the expected result of the first compare operation (rA) and 2) resultX is equal to the expected result of the first compare operation. If both conditions are met, insufficient data hold time at the stage under test is presumed. Accordingly, in an embodiment having circuitry to adjust the phase of the control strobes supplied to the internal pipeline stages, the operations shown at 509-515 may be undertaken to incrementally advance the control strobe supplied to the stage under test until reliable operation is achieved or until the control strobe has been advanced to a maximum degree (i.e., timing delay reaches a minimum value as shown at 515) without correcting for the presumed failure. More specifically, at 509, all control strobes are enabled in preparation for a control strobe adjustment operation. At 511, the control strobe for the stage under test is incrementally advanced and, at 513, a compare operation using different data than had been previously applied (e.g., cmpB meaning compare instruction, cpB, with data, dB) is executed. At decision block 515, the result of the compare operation is evaluated to determine if the expected data has been received (i.e., rB in the first iteration through blocks 509-515). If so, then the control strobe setting may be recorded, for example, in a one-time programming operation within the semiconductor device (e.g., in a non-volatile memory or fuse-blowing operation) or may be recorded in a non-volatile storage (e.g., a boot-up read-only-memory (ROM) such as a basic input/output services (BIOS) storage) for run-time retrieval and programming within a volatile configuration register of the semiconductor device.

If, at decision block 515, the expected result is not obtained, the operations of blocks 511 and 513 may be repeated (with yet different data applied in the compare operation at block 513) and the result evaluated again at decision block 515. If, after iterating through operations 509, 511 and 513 a sufficient number of times to reach a minimum control strobe delay setting (i.e., control strobe advanced to a maximum degree), the expected result is still not received, the timing failure may be deemed irreparable and the device discarded or marked for repair.

Returning to decision block 507, if resultA matches expected result rA or if resultX does not match rA, then a timing failure exists at a stage other than the stage under test. Accordingly, at block 521, the stage-under-test variable (SUT) is decremented to select the preceding internal pipeline stage as the stage under test. If SUT is less than one (determined at decision block 523), then all stages have been tested without achieving the desired result and therefore without isolating the problem to a single-point of failure. In that circumstance a multi-point failure may be assumed. In one embodiment, a multi-point failure test, discussed below, may be carried out to identify the failure locations. Alteratively, the part may be discarded or marked for repair. If all stages have not been tested (i.e., SUT determined to be greater than or equal to one at decision block 523), then all control strobes are enabled to block 525 in preparation for a repetition of the operation at blocks 503 for the newly selected stage under test. By this operation, the hold time at each of the internal pipeline stages may be tested to determine if the input to a given stage is the source of timing failure.

Returning to the phase adjust operation at block 511, it should be noted that, when such phase adjust operation is being performed on the control strobe for a stage other than the last stage, it may be desirable to additionally advance the phase of the control strobe for each downstream pipeline stage (including the phasing of the sampling time in the output buffer), to compensate for the phase shift in the output-valid time for the stage under test.

Figure 12:
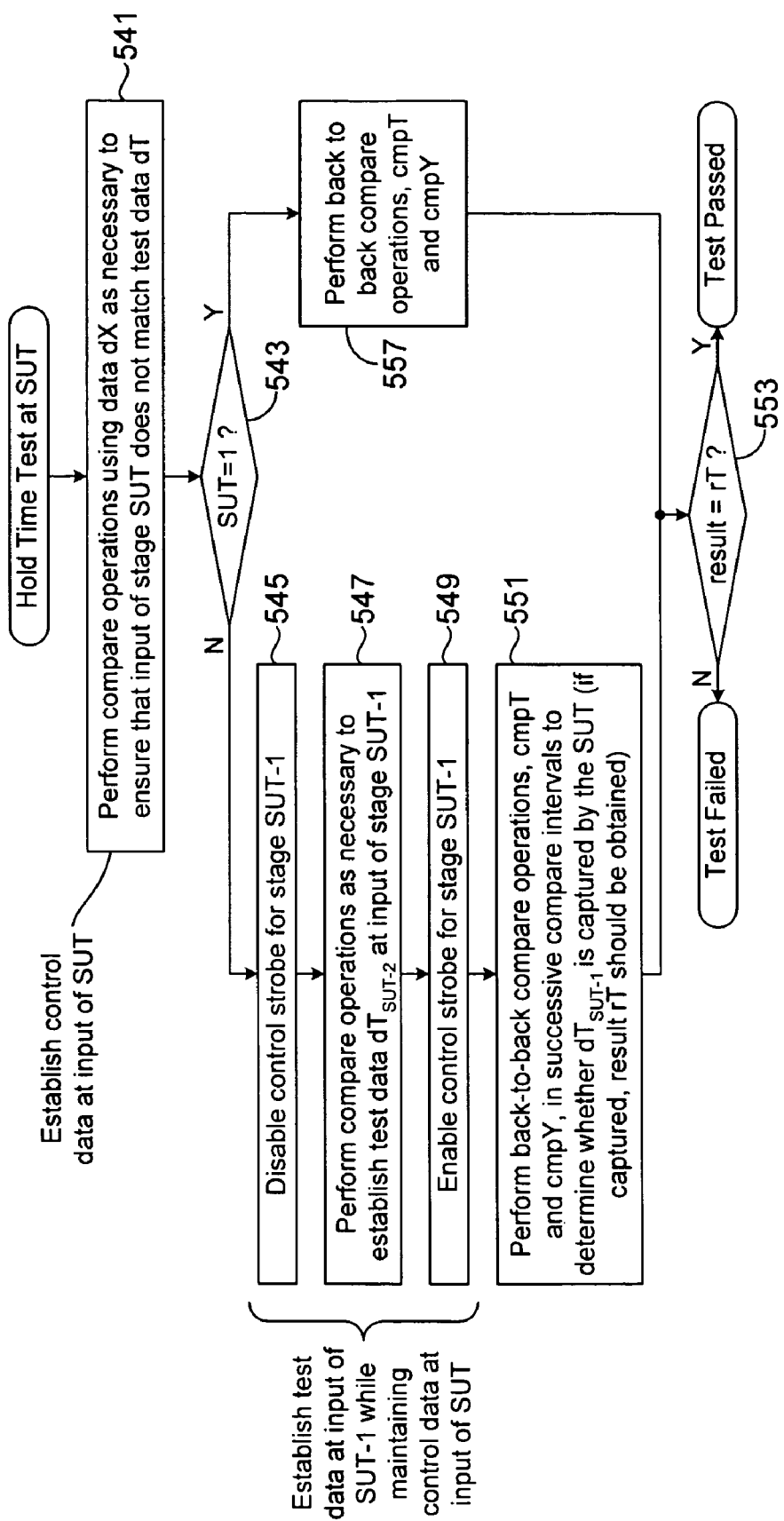
FIG. 12 illustrates a flow diagram of a hold-time test according to an embodiment that involves the control and trigger operations described above in reference to FIG. 7.

FIG. 12 illustrates a flow diagram of a hold-time test according to an embodiment that involves the control and trigger operations described above in reference to FIG. 7. More specifically, at 541, compare operations are repeated as necessary using control data dX to ensure that the data input to a stage under test does not match test data dT to be applied in subsequent compare operations. If the stage under test is not the first internal pipeline stage (i.e., SUT=1, as determined in decision block 543), test data is established at the input of the control stage (i.e., the pipeline stage that feeds the stage under test) while maintaining the control data $dX_{SUT-1}$ at the input of the stage under test. That is, at 545 the control strobe for the stage under test is disabled. At 547, compare operations are performed as necessary using test data dT to establish test data state, $dT_{SUT-2}$, at the input of the control stage, and at 549, the control strobe for the control stage is enabled to arm the setup-time test. At 551, back-to-back compare operations using test data dT and dY, respectively, are initiated to trigger a hold-time test at the stage under test. The result of the first compare operation (cmpT) is evaluated at decision block 553. If the expected result, rT, is obtained (i.e., test passed), then the hold-time at the stage under test is sufficient. If any other result is obtained, a hold time failure at the stage under test is presumed (i.e., assuming sufficient hold time has been established at all downstream pipeline stages) and, if circuitry for adjusting the phase of the control strobe to the stage under test is provided, the phase of the control strobe (and, if necessary, control strobes for downstream stages) may be advanced as necessary to establish sufficient hold time at the stage under test. Returning to decision block 543, if the stage under test is the first internal pipeline stage (i.e., SUT=1), then back-to-back compare operations using test data dT and dY may be executed (i.e., without performing the data setup and test arming operations at 545, 547 and 549) to determine whether the hold time at the first internal pipeline stage is sufficient.

The hold-time test described in reference to FIG. 12 may be performed on each stage in succession (e.g., generally as described in reference to FIG. 8B), with the phase of control strobes for failing stages advanced as necessary to achieve sufficient data hold time at the input of each pipeline stage.

Figure 13:
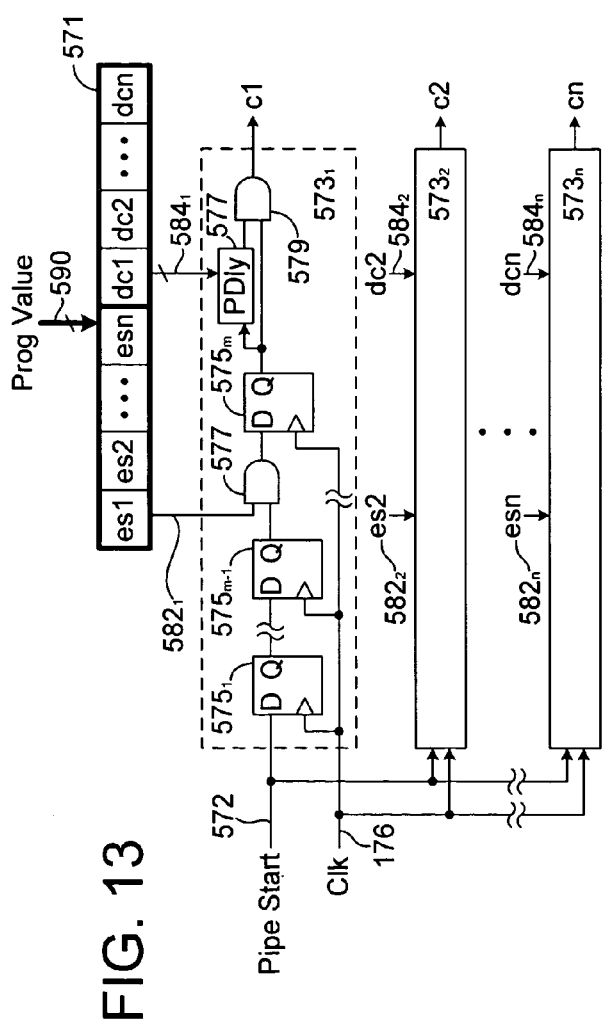
FIG. 13 illustrates an embodiment of a control strobe generator having a programmable enable function and a programmable delay function.

FIG. 13 illustrates an embodiment of a control strobe generator 570 having a programmable enable function and a programmable delay function. The control strobe generator 570 includes a set of control strobe circuits $573_1$-$573_n$ for generating control strobes c1-cn; the control strobe signal to be supplied to internal pipeline stages S1-Sn, respectively, of a pipelined-architecture device. The control strobe generator 570 additionally includes a control-strobe enable register 571 that may be programmed to enable or disable the operation of each of the control strobe circuits $573_1$-$573_n$ (e.g., as necessary to carry out the setup-time tests described above) and, in one embodiment, to provide a respective programmed delay control value (dc1-dcn) to each of the control strobe circuits. In one embodiment, the control-strobe enable register is programmed with a program value 590 in response to a program instruction received within an instruction decoder or other control circuitry of the host device.

A pipe-start signal 572, generated in response to an incoming instruction, is provided to each of the control strobe circuits $573_1$-$573_n$ along with a clock signal 176. In alternative embodiments, the pipe-start signal may be delayed by one or more series-coupled flip-flop stages to achieve a synchronized delay that is common to each of the control strobe circuits $573_1$-$573_n$. For example, if each of the control strobe signals c1-cn is to be delayed relative to assertion of the pipe-start signal 572 by at least Q cycles of clock signal 176, then Q series-coupled flip-flops may be coupled between the pipe-start signal and the inputs of the contact strobe circuits $573_1$-$573_n$ to establish the Q-clock-cycle delay.

Referring to the detail view of control strobe circuit $573_1$, each of the control strobe circuits $573_1$-$573_n$ may include some number of flip-flops $575_1$-$575_m$ coupled in daisy-chain fashion (i.e., output-to-input) to achieve a delay for a desired number of clock cycles. In a control strobe circuit 573 that requires no clock cycle delay, flip-flop stages 575 may be omitted altogether. The strobe inputs of the flip-flops 575 are coupled to receive the clock signal 176 and the output of each flip-flop 575 is coupled directly or indirectly to the input of the next flip-flop in the chain, thus enabling assertion of the pipe-start signal 572 to ripple through the flip-flops 575 and be asserted at the final flip-flop in the chain after Q clock cycles have transpired. In the embodiment shown, a logic AND gate 577 is coupled to receive the output of flip-flop $575_{m-1}$ at a first input, an enable-strobe bit $582_1$ (es1) from the control-strobe enable regions 571 at a second input, and has an output coupled to the input of flip-flop $575_m$. By this arrangement, when enable-strobe bit es1 is asserted (e.g., programmed to a logic high state), logic AND gate 577 passes the output of flip-flop $575_{m-1}$ to the input of flip-flop $575_m$ and thus, enables the control strobe signal to be asserted by the control strobe circuit $573_1$. If the enable bit is deasserted (e.g., logic low), the input to flip-flop $575_m$ is forced low, thereby preventing the output of flip-flop $575_m$ from going high and therefore preventing the control strobe circuit $573_1$ from asserting control strobe c1. Note that the AND gate 577 may be disposed between any pair of flip-flops 575 (or prior to the first flip-flop in the chain) in alternative embodiments. Also, assuming the delay of the AND gate 577 is accounted for in the overall delay path, the AND gate 577 may be disposed after the final flip-flop 575 in the chain.

The output of the final flip-flop $575_m$ (or the output of the AND gate 577 if no flip-flops are provided) is coupled a programmable delay element 577 which introduces one of a number of different propagation delay intervals according to the value of the corresponding delay control value $584_1$ (dc1) received from the control-strobe enable register 571 (note that separate registers may alteratively be provided to store the delay control values and the control strobe enable signals). The output of the programmable delay element 577 is supplied to a second logic AND gate 579 along with the output of the final flip-flop $575_m$ (or the output of the first logic AND gate 577 if no flip-flops 575 are provided). By this arrangement, the logic AND gate 579 asserts the control strobe-signal after a delay that is the sum of the delay through the chain of flip-flops 575 (Q clock cycles), plus the delay through the programmable delay element 577. Note that AND gate 579 may be omitted in an alternative embodiment, and the programmable delay element 577 used to directly supply strobe signal c1. More generally, any circuit capable of generating a desired output delay may be used to implement the control strobe circuits $573_1$-$573_n$ in alternative embodiments.

Figure 14:
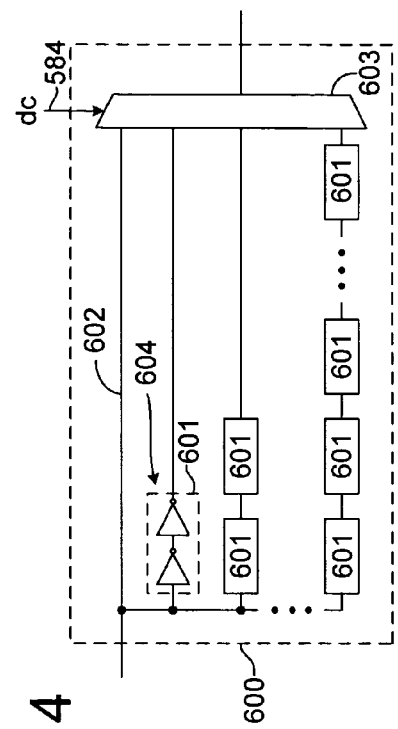
FIG. 14 illustrates an embodiment of a programmable delay circuit that may be used to implement the programmable delay element within one or more of the control strobe circuits of FIG. 13.

FIG. 14 illustrates an embodiment of a programmable delay circuit 600 that may be used to implement the programmable delay element 577 within one or more of the control strobe circuits 573 of FIG. 13. In the embodiment shown, a multiplexer 603 is provided to select, according to the state of a delay control value 584 (which may be a multi-bit value), one of a plurality of delay lines that may include a wire delay line 602, and delay lines having progressively increasing numbers of series-coupled delay elements 601 (e.g., implemented by a series coupled pair of inverters as shown at 604, or any other delay element). Any other circuit capable of introducing one of a number of different signal propagation delays according to a delay control value may be used in alternative embodiments. Also, in one embodiment, the initial (or default) state of the delay control value is such as to select a propagation delay time that is approximately midway between the minimum and propagation delay times of programmable delay circuit 600, thereby enabling the phase of each control strobe to be advanced or retarded as necessary to compensate for set-up time and hold-time failures.

In embodiments of the invention, the above-described testing and timing configuration operations may be carried out using various types of testing equipment including, for example and without limitations, automated test equipment (ATE), logic analyzers and the like. Also, the testing and/or timing configuration operations may be performed within a system that includes the semiconductor device under test. In one embodiment, such a system may include a processing entity and a system memory. The processing entity may include one or more processors (e.g., general-purpose processors and/or special-purposes processors such as a network processor), and the system memory may include any number of component memories including, without limitation, volatile and/or non-volatile memories. The processing entity (e.g., one or more processors) executes one or more sequences of one or more instructions stored in the system memory to perform the operations described above (e.g., issuance of compare instructions and corresponding data and instructions or signals to effect control strobe enable and disable, as well as instructions to carry out control strobe phase adjustment operations). In alternative embodiments, hard-wired circuitry may be used in place of or in combination with the programmed processing entity to implement the invention. Thus, embodiments of the invention are not limited to any specific combination of hardware circuitry and software.

The instructions executed by the processing entity to perform the operations described above may be transferred to the system memory from a computer-readable medium. A computer-readable medium may take many forms, including but not limited to, non-volatile media, volatile media, and transmission media. Non-volatile media may include, for example, optical or magnetic media (e.g., disks) and/or non-volatile semiconductor memory (e.g., flash memory or battery-backed memory). Transmission media includes coaxial cables, copper wire and fiber optics and the like. Transmission media can also take the form of acoustic or electromagnetic waves, such as those generated during radio-wave and infra-red data communications.

Any or all of the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readably media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfer of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readably media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

The section headings provided in this detailed description are for convenience of reference only, and in no way define, limit, construe or describe the scope or extent of such sections. Also, while the invention has been described with reference to specific embodiments thereof, it will be evident that various modifications and changes may be made therein without departing from the broader spirit and scope of the invention. Accordingly, the specification and drawings are to be regarded in an illustrative rather than a restrictive sense.

What is claimed is:

1. A method of testing a semiconductor device having a pipelined architecture, the method comprising:

disabling operation of a first pipeline stage of the semiconductor device during a first pipelined operation to established test data at an input of a second pipeline stage of the semiconductor device;

executing a second pipelined operation to enable the second pipeline stage to generate an intermediate result using the test data; and evaluating a final result of the second pipelined operation to determine whether the second pipeline stage produced a correct intermediate result, wherein the semiconductor device comprises a content addressable memory array and wherein executing the second pipelined operation comprises searching the content addressable memory array to determine if contents thereof match a search value.

2. The method of claim 1 wherein the disabling operation comprises disabling assertion of a control signal that is used to initiate the first pipelined operation.

3. The method of claim 1 further comprising executing at least one third pipeline operation to establish a control data state at the input of the second pipeline stage.

4. A method of testing a semiconductor device having a pipelined architecture, the method comprising:

disabling operation of a first pipeline stage of the semiconductor device during a first pipelined operation to establish test data at an input of a second pipeline stage of the semiconductor device;

executing a second pipelined operation to enable the second pipeline stage to generate an intermediate result using the test data; and evaluating a final result of the second pipelined operation to determine whether the second pipeline stage produced a correct intermediate result, further comprising operating a third pipelined operation prior to the first pipelined operation to generate the test data at an output of the first pipeline stage, the output of the first pipeline stage being coupled to the input of the second pipeline stage.

5. The method of claim 4 wherein the disabling operation enables the test data to remain in a substantially steady-state at the input of the second pipeline stage for an extended period of time.

6. The method of claim 5 wherein the extended period of time is long enough to ensure sufficient a setup time at the second pipeline stage during the second pipeline operation.

7. The method of claim 5 further comprising concluding that a setup time at the input of the second pipeline stage is insufficient if the final result does not match an expected result.

8. A method of testing a semiconductor device having a pipelined architecture, the method comprising:
disabling operation of a first pipeline stage of the semiconductor device during a first pipelined operation to establish test data at an input of a second pipeline stage of the semiconductor device;
executing a second pipelined operation to enable the second pipeline stage to generate an intermediate result using the test data;
evaluating a final result of the second pipelined operation to determine whether the second pipeline stage produced a correct intermediate result; and
delaying a control signal used to initiate the second pipelined operation if the final result does not match an expected result, wherein delaying the control signal effects an increase in a setup time at the input of the second pipeline stage, and wherein the disabling operation enables the test data to remain in a substantially steady-state at the input of the second pipeline stage for an extended period of time.

9. The method of claim 8 wherein the delaying comprising laoding a program value into a delay control register, the program value selecting one of a plurality of delay times for the control signal having a greater delay than a previously selected one of the plurality of delay times.

10. The method of claim 8 further comprising performing a third pipelined operation after delaying the control signal to determine if an expected final result is obtained.

11. A method of testing a semiconductor device having a pipelined architecture, the method comprising:
disabling operation of a first pipeline stage of the semiconductor device during a first pipelined operation to establish test data at an input of a second pipeline stage of the semiconductor device;
executing a second pipeline operation to enable the second pipeline stage to generate an intermediate result using the test data; and
evaluating a final result of the second pipelined operation to determine whether the second pipeline stage produced a correct intermediate result, wherein the disabling operation comprises executing the first pipelined operation to establish data at an input of the first pipeline stage that will, during execution of the second pipelined operation, cause the data at the input of the second pipeline stage to transition from a first data state to a second data state.

12. The method of claim 11 wherein executing a second pipelined operation to enable the second pipeline stage to generate an intermediate result comprises executing the second pipelined operation to yield a final result that corresponds to the second data state.

13. The method of claim 12 further comprising concluding that setup time at the input of the second pipeline stage is insufficient if the final result does not correspond to the second data state.

14. The method of claim 13 further comprising delaying a control signal used to initiate the second pipelined operation if the final result does not correspond to the second data state, wherein delaying the control signal effects an increase in the setup time at the input of the second pipeline stage.

15. A semiconductor device comprising:
a plurality of pipelined logic stages coupled to one another;
a control circuit to receive an instruction to perform a pipelined operation within the plurality of pipelined logic stages, the control circuit including a timing circuit to output a plurality of control signals to the plurality of pipelined logic stages to initiate operation of each of the pipelined logic stages at an appropriate time; and
a first programmable circuit to store a plurality of enable values and which is coupled to the timing circuit to selectively enable the timing circuit to output each of the plurality of control signals according to the state of a respective one of the plurality of enable values,
wherein at least one pipelined logic stage comprises a content addressable memory array and wherein the pipelined operation comprises a comparison with a search data value with contents of the content addressable memory array.

16. A semiconductor device comprising:
a plurality of pipelined logic stages coupled to one another;
a control circuit to receive an instruction to perform a pipelined operation within the plurality of pipelined logic states, the control circuit including a timing circuit to output a plurality of control signals to the plurality of pipelined logic stages to initiate operation of each of the pipelined logic stages at an appropriate time;
a first programmable circuit to store a plurality of enable values and which is coupled to the timing circuit to selectively enable the timing circuit to output each of the plurality of control signals according to the state of a respective one of the plurality of enable values; and
a second programmable circuit to store a plurality of delay control values each to determine a time at which a corresponding one of the plurality of control signals is output by the timing circuit.

17. The semiconductor device of claim 16 further comprising a configuration register that includes the first and second programmable circuits.

18. A semiconductor device comprising:
a plurality of pipeline stages coupled to one another;
means for disabling operation of a first pipeline stage of the plurality of pipeline stages during a first pipelined operation to establish test data at an input of a second pipeline stage of the plurality of pipeline stages;
means for executing a second pipelined operation to enable the second pipeline stage to generate an intermediate result using the test data; and
means for evaluating a final result of the second pipelined operation to determine whether the second pipeline stage produced a correct intermediate result, wherein the semiconductor device comprises a content addressable memory array and wherein executing the second pipelined operation comprises searching the content addressable memory array to determine if contents thereof match a search value.

* * * * *